US008633399B2

(12) United States Patent
Kagaya

(10) Patent No.: US 8,633,399 B2
(45) Date of Patent: Jan. 21, 2014

(54) DIFFERENTIAL TRANSMISSION CIRCUIT, OPTICAL MODULE, AND INFORMATION PROCESSING SYSTEM

(75) Inventor: Osamu Kagaya, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 147 days.

(21) Appl. No.: 13/403,048

(22) Filed: Feb. 23, 2012

(65) Prior Publication Data
US 2012/0229998 A1 Sep. 13, 2012

(30) Foreign Application Priority Data

Mar. 8, 2011 (JP) ................................. 2011-050849
Jan. 6, 2012 (JP) ................................. 2012-001658

(51) Int. Cl.
*H05K 1/11* (2006.01)

(52) U.S. Cl.
USPC ............... 174/261; 174/250; 333/4; 333/238; 361/777; 361/778

(58) Field of Classification Search
USPC ............ 361/777, 778; 174/250, 261; 333/238
See application file for complete search history.

(56) References Cited

U.S. PATENT DOCUMENTS

| | | | | |
|---|---|---|---|---|
| 5,808,241 A * | 9/1998 | Brooks | ............... | 174/250 |
| 6,072,699 A * | 6/2000 | Horine | ............... | 361/777 |
| 6,172,305 B1 * | 1/2001 | Tanahashi | ............... | 174/255 |
| 6,930,888 B2 * | 8/2005 | Miller | ............... | 361/772 |
| 7,061,771 B2 * | 6/2006 | Miller | ............... | 361/772 |
| 7,301,418 B2 * | 11/2007 | Kanno et al. | ............... | 333/4 |
| 7,361,845 B2 * | 4/2008 | Yamamoto et al. | ........... | 174/260 |
| 7,495,523 B2 * | 2/2009 | Kanno et al. | ............... | 333/4 |
| 7,532,820 B2 * | 5/2009 | Aronson | ............... | 398/135 |
| 7,652,364 B2 * | 1/2010 | Knighten et al. | ............. | 257/692 |
| 7,830,221 B2 * | 11/2010 | Merritt | ............... | 333/1 |
| 2005/0058455 A1 * | 3/2005 | Aronson et al. | ............. | 398/135 |
| 2007/0063782 A1 | 3/2007 | Kanno et al. | | |
| 2007/0063783 A1 | 3/2007 | Kanno et al. | | |
| 2008/0116989 A1 | 5/2008 | Kanno et al. | | |
| 2012/0325542 A1 * | 12/2012 | Yokoyama | ............... | 174/262 |

FOREIGN PATENT DOCUMENTS

JP 3954641 B2 8/2007

* cited by examiner

*Primary Examiner* — Hoa C Nguyen
*Assistant Examiner* — Keith Depew
(74) *Attorney, Agent, or Firm* — Mattingly & Malur, PC

(57) ABSTRACT

A differential transmission circuit includes a pair of transmission line conductors and a ground conductor layer, wherein the pair of transmission line conductors include a first straight line region where both the pair of transmission line conductors extend in parallel to each other in a first direction with a first width in a first layer, a first cross region where one of the pair of transmission line conductors is formed in the first layer, the other thereof is formed in a second layer, and the pair of transmission line conductors cross the each other in a three-dimensional manner, the first cross region being disposed on the front side of the first straight line region, and wherein each of the widths of the pair of transmission line conductors in the first cross region is smaller than the first width.

23 Claims, 16 Drawing Sheets

DIFFERENTIAL TRANSMISSION CIRCUIT, OPTICAL MODULE, AND INFORMATION PROCESSING SYSTEM

CROSS-REFERENCE TO RELATED APPLICATIONS

The present application claims priority from Japanese applications JP 2011-050849 filed on Mar. 8, 2011 and JP 2012-001658 filed on Jan. 6, 2012, the contents of which are hereby incorporated by reference into this application.

BACKGROUND OF THE INVENTION

1. Field of the Invention

The present invention relates to a differential transmission circuit, and an optical module and an information processing system using the same, and more particularly to improvement in quality of a transmission signal transmitted on the differential transmission line.

2. Description of the Related Art

A transmission line is used for high-speed digital signal transmission. For example, differential transmission is generally used for digital signal transmission of several hundreds of Mbps or more instead of single-end transmission, and a transmission line for performing the differential transmission is a differential transmission line. The differential transmission line is formed by a ground conductor layer, and a pair of (two) transmission line conductors provided over the ground conductor layer via a dielectric layer, extending in a strip shape, and formed in the same layer. The differential transmission is advantageous in that the amplitude of a signal voltage is made to be small, and thus influence of noise hardly exerts, whereas it is disadvantageous in that transmitted differential signals is deteriorated if the lengths of a pair of transmission line conductors are different from each other. This is because a delay time difference is generated in two differential signals transmitted on the differential transmission line if the lengths of a pair of transmission line conductors are different from each other. Therefore, a pair of transmission line conductors are generally formed to be parallel to each other and to extend in a straight line shape such that the lengths of a pair of transmission line conductors are the same as each other. However, there are cases where it is necessary for the transmission line to be disposed so as to be bent depending on positional relationship or the like with elements disposed on a printed circuit board.

FIG. 26 is a plan view illustrating an example of the differential transmission line according to a related art. The differential transmission line shown in FIG. 26 includes a bent region which is bent by 90 degrees and a straight line region which extends in parallel. FIG. 26 shows a P data conductor film 181 and an N data conductor film 281 as a pair of transmission line conductors, and, in the bent region, the length of the P data conductor film 181 passing the outside is larger than the length of the N data conductor film 281 passing the inside. Therefore, a delay time difference occurs in two differential signals transmitted on the differential transmission line.

As related arts for compensating for the length difference of a pair of transmission line conductors, due to the presence of the bent region, there are the two following techniques. One is a technique where the lengths of two conductor films are the same as each other through examination of the shapes of the P data conductor film 181 and the N data conductor film 281, thereby achieving equal length wires. That is to say, the N data conductive film 281 which has a shorter length due to the bent region has a shape which is partially meandered in other regions, so as to reduce the length difference of a pair of transmission line conductors, thereby compensating for the delay time difference occurring in two differential signals.

The other is a technique where plural slots are provided on the ground conductor layer in the bent region of the differential transmission line, and the technique is disclosed in Japanese Patent No. 3954641. In the bent region of the differential transmission line, plural slots are provided on the ground conductor layer which is located under a pair of transmission line conductors, and thereby a high frequency current flowing through the ground conductor layer corresponding to the transmission line conductor with the smaller length circumvents the slots so as to compensate for the delay time difference of two differential signals occurring due to the length difference of a pair of transmission line conductors.

SUMMARY OF THE INVENTION

With the demands for miniaturization of devices, low costs, high function, and the like, in recent years, higher density mounting has been required on the printed circuit board.

In the method of achieving equal length wires through examination of shapes of a pair of transmission line conductors, a cross-sectional shape of the differential transmission line can be the same in many regions, and thus reflection loss is easily suppressed. However, since the transmission line conductors have shapes which are partially meandered, regions for the meandered part are required to be secured, which causes an increase in a pattern area of the transmission line conductors, and thereby it is difficult to perform high density mounting on the printed circuit board.

In contrast, in the technique disclosed in Japanese Patent No. 3954641, since compensation for the delay time difference in the bent region is made, a region for the compensation is not required to be provided in the transmission line conductors separately, and an increase in the pattern area of the transmission line conductors is suppressed. However, since plural slots are provided on the ground conductor layer, a part of electromagnetic waves generated between a pair of transmission line conductors and the ground conductor layer pass through plural slots and spread on an opposite side to the ground conductor layer. This is a cause of noise. In order to suppress the noise, there is a requirement of a countermeasure where a ground conductor layer having no slots is further added on the opposite side to the ground conductor layer, and thus it is difficult to perform high density mounting on the printed board. In addition, since the cross-sectional shapes of the differential transmission lines are different depending on presence or absence of the slots, there is a problem in that reflection loss of the transmission line is increased, a design for suppressing reflection loss is complicated, and thus time and costs required for the design and product verification are increased.

The present invention has been made in consideration of the related circumstances, and an object thereof is to provide a differential transmission circuit, and an optical module and an information processing system using the same, capable of suppressing a delay time difference occurring in two differential signals and achieving high density mounting even if the differential transmission line includes a bent region.

(1) According to an aspect of the present invention, there is provided a differential transmission circuit including a ground conductor layer; and a pair of transmission line conductors which are provided together on one side of the ground conductor layer via a dielectric layer, wherein the ground conductor layer includes a region opposite to the pair of transmission line conductors and spreads outside the region, wherein the pair of transmission line conductors and the ground conductor layer form a pair of transmission lines, wherein the pair of transmission line conductors include a first straight line region where both the pair of transmission line conductors extend in parallel to each other in a first direction with a first width in a first layer; a first cross region where a first transmission line conductor of the pair of transmission line conductors is formed in the first layer, a second transmission line conductor of the pair of transmission line conductors is formed in a second layer which is different from the first layer, and the pair of transmission line conductors cross the each other in a three-dimensional manner via the dielectric layer, the first cross region being disposed on the front side of the first straight line region, and wherein each of the widths of the pair of transmission line conductors in the first cross region is smaller than the first width.

(2) In the differential transmission circuit set forth in (1), the second transmission line conductor of the pair of transmission line conductors may include a first via hole between the first straight line region and the first cross region, the second transmission line conductor of the pair of transmission line conductors may extend in the first layer from the first straight line region to the first via hole, penetrate through the first via hole from the first layer to the second layer, and further extend in the second layer through the first cross region, and at least one of the pair of transmission line conductors may be bent between the first straight line region and the first cross region.

(3) In the differential transmission circuit set forth in (2), the second transmission line conductor of the pair of transmission line conductors may further include a second via hole located on the front side of the first cross region. The second transmission line conductor of the pair of transmission line conductors may extend in the second layer from the first cross region to the second via hole, penetrate through the second via hole from the second layer to the first layer, and further extend toward the front side in the first layer, and at least one of the pair of transmission line conductors may be bent on the front side of the first cross region.

(4) In the differential transmission circuit set forth in (3), only one of the pair of transmission line conductors may be bent in a second direction different from the first direction from the first direction between the first straight line region and the first cross region, and only the other of the pair of transmission line conductors may be bent in the second direction from the first direction on the front side of the first cross region. In the first straight line region, the one transmission line conductor may be an outer transmission line conductor, and the other transmission line conductor may be an inner transmission line conductor, with respect to the bending in the second direction from the first direction.

(5) In the differential transmission circuit set forth in (4), the pair of transmission line conductors may further include a second straight line region where both the pair of transmission line conductors extend in the second direction in parallel to each other with a second width and are formed in the first layer, the second straight line region being located on the front side of the second via hole.

(6) In the differential transmission circuit set forth in (5), the second width may be the same as the first width.

(7) In the differential transmission circuit set forth in (3), in a case where wire lengths of the transmission line conductors measured in a planar manner when viewed from the upper side of the ground conductor layer are compared, the wire length of the first transmission line conductor may be larger than the wire length of the second transmission line conductor so as to compensate for an increase in the delay time due to thicknesses of the first and second via holes.

(8) In the differential transmission circuit set forth in (7), the first transmission line conductor of the pair of transmission line conductors may have a portion which detours and extends so as to compensate for the increase in the delay time due to the thicknesses of the first and second via holes.

(9) In the differential transmission circuit set forth in (3), the first transmission line conductor of the pair of transmission line conductors may further include a third via hole and a fourth via hole. The first transmission line conductor of the pair of transmission line conductors may extend toward the third via hole located on the front side in the first layer, penetrate through the third via hole from the first layer to the second layer, further extend toward the fourth via hole located on the front side in the second layer, penetrate through the fourth via hole from the second layer to the first layer, and further extend toward the front side in the first layer.

(10) In the differential transmission circuit set forth in (5), the pair of transmission line conductors may further include a second cross region where a third transmission line conductor of the pair of transmission line conductors is formed in the first layer, a fourth transmission line conductor thereof is formed in the second layer, and the pair of transmission line conductors cross each other in a three-dimensional manner via the dielectric layer, the second cross region being located on the front side of the second straight line region, and a third straight line region where both the pair of transmission line conductors extend in a third direction different from the second direction in parallel to each other with a third width and are formed in the first layer, the third straight line region being located on the front side of the second cross region. The fourth transmission line conductor of the pair of transmission line conductors may further include a third via hole between the second straight line region and the second cross region, and a fourth via hole between the second cross region and the third straight line region. The fourth transmission line conductor of the pair of transmission line conductors may extend toward the third via hole located on the front side in the first layer, penetrate through the third via hole from the first layer to the second layer, further extend toward the fourth via hole located on the front side in the second layer, penetrate through the fourth via hole from the second layer to the first layer, and further extend toward the third straight line region located on the front side in the first layer. In addition, a direction of the direction variation of the third direction with respect to the second direction may be the same as a direction of the direction variation of the second direction with respect to the first direction, only the other of the pair of transmission line conductors may be bent in the third direction from the second direction between the second straight line region and the second cross region, and only the one of the pair of transmission line conductors may be bent in the third direction from the second direction between the second cross region and the third straight line region. Each of the widths of the pair of transmission line conductors in the second cross region may be smaller than the third width.

(11) In the differential transmission circuit set forth in (10), the first transmission line conductor of the pair of transmission line conductors may be the fourth transmission line conductor of the pair of transmission line conductors.

(12) In the differential transmission circuit set forth in (10), both the second width and the third width may be the same as the first width.

(13) In the differential transmission circuit set forth in (2), the first transmission line conductor of the pair of transmission line conductors may include a second via hole on the front side of the first cross region. The pair of transmission line conductors may include a second straight line region where the pair of transmission line conductors extends in a second direction different from the first direction in parallel to each other with a second width and are formed in the second layer, the second straight line region being located on the front side of the second via hole. Here, the first transmission line conductor of the pair of transmission line conductors may extend toward the second via hole from the first straight line region through the first cross region, penetrate through the second via hole from the first layer to the second layer, and further extend toward the second straight line region in the second layer. The second transmission line conductor of the pair of transmission line conductors may further extend toward the second straight line region from the first via hole in the second layer. In addition, only one of the pair of transmission line conductors may be bent in the second direction from the first direction between the first straight line region and the first cross region, and only the other of the pair of transmission line conductors may be bent in the second direction from the first direction between the first cross region and the second straight line region. Here, in the first straight line region, the one transmission line conductor may be an outer transmission line conductor, and the other transmission line conductor may be an inner transmission line conductor, with respect to the bending in the second direction from the first direction.

(14) In the differential transmission circuit set forth in (13), the pair of transmission line conductors may further include a second cross region where a third transmission line conductor of the pair of transmission line conductors is formed in the first layer, a fourth transmission line conductor thereof is formed in the second layer, and the pair of transmission line conductors cross each other in a three-dimensional manner via the dielectric layer, the second cross region being located on the front side of the second straight line region, and a third straight line region where both the pair of transmission line conductors extend in a third direction different from the second direction in parallel to each other with a third width and are formed in the first layer, the third straight line region being located on the front side of the second cross region. Here, the third transmission line conductor of the pair of transmission line conductors may further includes a third via hole between the second straight line region and the second cross region, and the fourth transmission line conductor of the pair of transmission line conductors may further include a fourth via hole between the second cross region and the third straight line region. Here, the third transmission line conductor of the pair of transmission line conductors may extend toward the third via hole located on the front side in the second layer, penetrate through the third via hole from the second layer to the first layer, and further extend toward the third straight line region in the first layer. In addition, the fourth transmission line conductor of the pair of transmission line conductors may extends toward the fourth via hole located on the front side in the second layer, penetrate through the fourth via hole from the second layer to the first layer, and further extend toward the third straight line region in the first layer. The direction of the direction variation of the third direction with respect to the second direction is this same as the direction of the direction variation of the second direction with respect to the first direction, and only the one of the pair of transmission line conductors may be bent in the third direction from the second direction between the second cross region and the third straight line region, and further extend toward the front side in the third direction, and only the other of the pair of transmission line conductors may be bent in the third direction from the second direction between the second straight line region and the second cross region, and further extend toward the front side in the third direction. At this time, each of the widths of the pair of transmission line conductors in the second cross region may be smaller than the third width.

(15) In the differential transmission circuit set forth in (1), the pair of transmission line conductors may be perpendicular to each other in the first cross region when viewed from the upper side of the ground conductor layer.

(16) In the differential transmission circuit set forth in (10), the pair of transmission line conductors may be perpendicular to each other in the second cross region when viewed from the upper side of the ground conductor layer.

(17) According to another aspect of the present invention, there is provided an optical module including the differential transmission line set forth in any one of (1) to (16).

(18) According to still another aspect of the present invention, there is provided an information processing system including a ground conductor layer; a dielectric layer provided on a surface of the ground conductor layer; a first transmission line that has a first conductive film, a second conductive film, and a third conductive film which are sequentially arranged according to a transmission direction and are electrically connected to each other; and a second transmission line that has a fourth conductive film, a fifth conductive film, and a sixth conductive film which are sequentially arranged according to a transmission direction and are electrically connected to each other, wherein the first conductive film, the second conductive film, the third conductive film, the fourth conductive film, and the sixth conductive film are provided on an upper surface of the dielectric layer, wherein the fifth conductive film is provided inside the dielectric layer and over the ground conductor layer, wherein both the first conductive film and the fourth conductive film extend in a first direction in parallel to each other with a first width, wherein both the third conductive film and the sixth conductive film extend in a second direction in parallel to each other with the first width, wherein the second conductive film and the fifth conductive film are disposed so as to cross each other in a three-dimensional manner in a cross region, and both the widths of the second conductive film and the fifth conductive film are smaller than first width in the cross region, and wherein the first and second transmission lines and the ground conductor layer form a pair of differential transmission lines.

(19) The information processing system set forth in (18), may further include a printed circuit board that includes the first and second transmission lines, the ground conductor layer, and the dielectric layer; a first integrated circuit that is mounted on the printed circuit board and includes a pair of differential clock signal output terminals outputting a pair of differential clock signals; and a second integrated circuit that is mounted on the printed circuit board and includes an input terminal receiving one of the pair of differential clock signals. Here, the first and fourth conductive films may be connected to the pair of differential clock signal output terminals, and any one of the third and sixth conductive films may be connected to the input terminal.

(20) The information processing system set forth in (19) may further include a termination resistor; and a shield cover that covers a region including the termination resistor and the second integrated circuit. Here, any one of the third and sixth conductive films may be connected to the input terminal, and the other of the third and sixth conductive films may be connected to the termination resistor.

(21) The information processing system set forth in (18) may further include a printed circuit board that includes the first and second transmission lines, the ground conductor layer, and the dielectric layer; a first integrated circuit that is mounted on the printed circuit board and includes a pair of differential clock signal output terminals outputting a pair of differential clock signals; a second integrated circuit that is mounted on the printed circuit board and includes a pair of differential input terminals receiving a pair of differential clock signals; and a shield cover that covers a region including the second integrated circuit. Here, the first and fourth conductive films may be connected to the pair of differential clock signal output terminals, and the third and sixth conductive films may be connected to the pair of differential input terminals.

(22) The information processing system set forth in (18) may further include a printed circuit board that includes the first and second transmission lines, the ground conductor layer, and the dielectric layer;
a first integrated circuit that is mounted on the printed circuit board and includes a pair of differential serial data output terminals outputting a pair of differential serial data signals; and an optical transmission element module that is mounted on the printed circuit board, has a pair of input terminals to which a pair of differential serial data signals are input, and outputs an optical modulation signal based on the input differential serial data signals. Here, the first and fourth conductive films are connected to the pair of differential serial data signal output terminals, and any one of the third and sixth conductive films may be connected to one of the pair of input terminals.

(23) In the information processing system set forth in (22), the optical transmission element module may further include an electro-absorption modulator integrated laser element, and first and second termination resistors. In addition, any one of the third and sixth conductive films may be connected to an electro-absorption modulator portion of the electro-absorption modulator integrated laser element and the first termination resistor, and the other of the third and sixth conductive films is connected to a laser diode of the electro-absorption modulator integrated laser element and the second termination resistor.

Effect of the Invention

According to the present invention, it is possible to provide a differential transmission circuit, and an optical module and an information processing system using the same, capable of suppressing a delay time difference occurring in two differential signals and achieving high density mounting even if the differential transmission line includes a bent region.

DETAILED DESCRIPTION OF THE INVENTION

Embodiments of the present invention will now be described in detail. Here, the following diagrams are only for explaining the embodiments, and the sizes in the diagrams and the scales in the embodiments do not necessarily correspond with each other.

[First Embodiment]

A differential transmission line and an optical transceiver module according to the first embodiment of the present invention will be described. Note that a differential transmission circuit according to the present invention may be defined as an electric circuit provided with a differential transmission line according to the present invention, and that optical modules according to the present invention include optical transceiver modules according to the present invention as example. A differential transmission line is also referred to as a balanced line or differential line.

Figure 1:
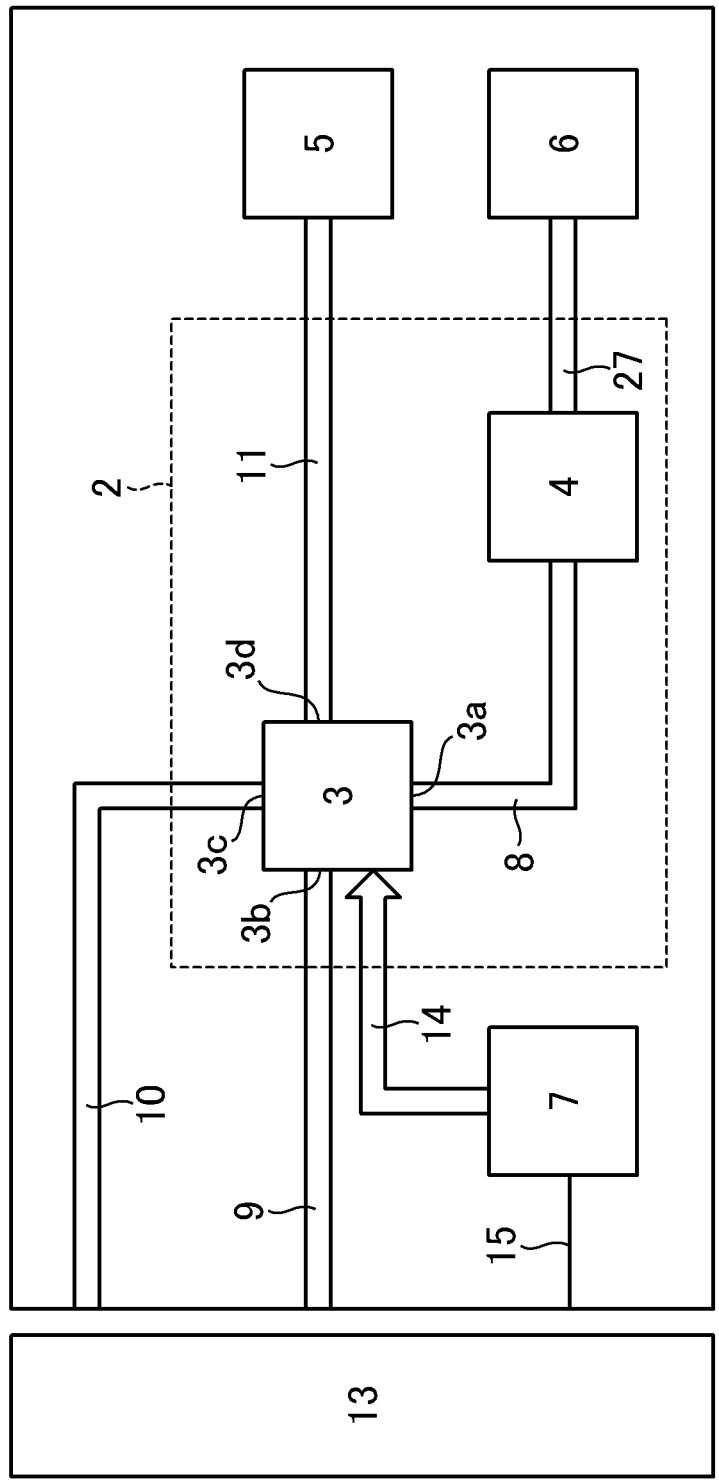
FIG. 1 is a block diagram of an optical transceiver module according to a first embodiment of the present invention.

FIG. 1 is a block diagram of an optical transceiver module 1 according to the first embodiment of the present invention. The optical transceiver module 1 according to the embodiment includes an optical transmission element module 6, an optical reception element module 5, a data transmission unit 2, and a control unit 7. In addition, the optical transceiver module 1 is connected to a transmission device body 13.

The data transmission unit 2 includes a transmitter and receiver integration type CDR (Clock Data Recovery) integrated circuit 3, and a driving integrated circuit 4. The transmitter and receiver integration type CDR integrated circuit 3 is an integrated circuit (IC) which integrates a transmission function and a reception function thereinto, and, in order to isolate the terminals from each other, a transmitter-side differential output terminal 3a, a transmitter-side differential input terminal 3b, a receiver-side differential output terminal 3c, and a receiver-side differential input terminal 3d are respectively disposed at four sides of the transmitter and receiver integration type CDR integrated circuit 3.

A differential transmission line 8 is disposed between the transmitter-side differential output terminal 3a of the transmitter and receiver integration type CDR integrated circuit 3 and a differential input terminal of the driving integrated circuit 4, and differential signals are transmitted from the transmitter and receiver integration type CDR integrated circuit 3 to the driving integrated circuit 4 on the differential transmission line 8. In the same manner, a transmitter-side differential output transmission line 27 is disposed between the driving integrated circuit 4 and the optical transmission element module 6.

A transmitter-side differential input transmission line 9 is disposed between the transmitter-side differential input terminal 3b of the transmitter and receiver integration type CDR integrated circuit 3 and the transmission device body 13, a receiver-side differential output transmission line 10 is disposed between the receiver-side differential output terminal 3c and the transmission device body 13, and a receiver-side differential input transmission line 11 is disposed between the receiver-side differential input terminal 3d and the optical reception element module 5.

An electric output signal which is serial data is transmitted from the transmission device body 13 to the transmitter and receiver integration type CDR integrated circuit 3 on the transmitter-side differential input transmission line 9 as a differential signal. The transmitter and receiver integration type CDR integrated circuit 3 performs waveform rectification or the like (CDR function) for the electric output signal, and transmits the electric output signal to the driving integrated circuit 4 via the differential transmission line 8. The driving integrated circuit 4 amplifies the electric output signal and transmits the amplified electric output signal to the optical transmission element module 6 via the transmitter-side differential output transmission line 27. In addition, the optical transmission element module 6 converts the electric output signal into an optical output signal, and transits the optical output signal to an optical fiber (not shown). Here, the optical transmission element module 6 is a light emitting element module which includes, for example, a Mach-Zehnder (MZ) modulator and a laser oscillator, and converts the electric optical signal into the optical output signal by the Mach-Zehnder modulator modulating laser light of the wavelength 1.5 μm band which is oscillated by the laser oscillator.

In a similar manner, the optical reception element module 5 receives an optical input signal input from the optical fiber (not shown), and converts the optical input signal into an electric input signal, and the electric input signal is transmitted to the transmitter and receiver integration type CDR integrated circuit 3 on the receiver-side differential input transmission line 11 as a differential signal. In addition, the transmitter and receiver integration type CDR integrated circuit 3 performs waveform rectification or the like (CDR function) for the electric input signal and transmits the electric input signal to the transmission device body 13 on the receiver-side differential output transmission line 10.

A control signal is input to the control unit 7 from the transmission device body 13 via a digital communication interface 15, and the control unit 7 controls a bias current used for the optical transmission element module 6 to oscillate laser light, controls an amplitude of a signal modulated into the optical output signal, and the like, via a control signal line 14 based on the input control signal. In addition, in a case where the optical transmission element module 6 includes a temperature control element (not shown), a temperature control or the like is performed.

Figure 2:
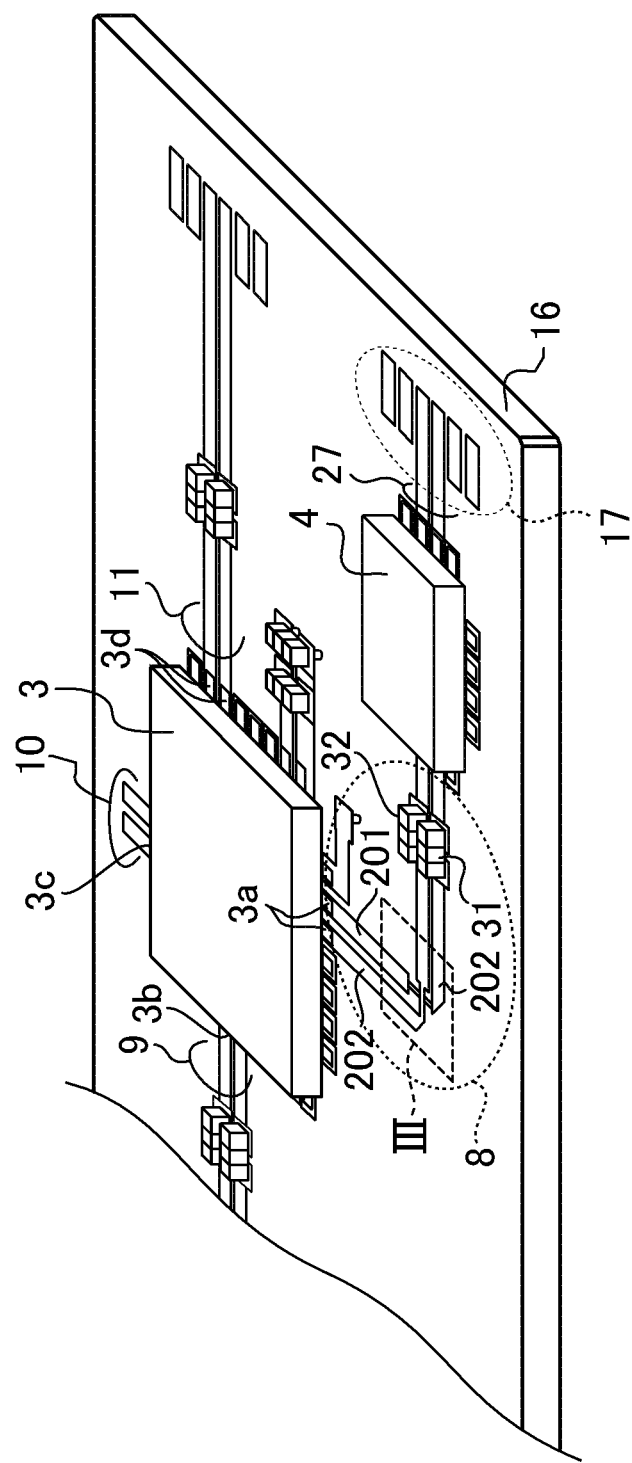
FIG. 2 is an overall perspective view of a data transmission unit of the optical transceiver module according to the first embodiment of the present invention.

FIG. 2 is an overall perspective view of the data transmission unit 2 of the optical transceiver module 1 according to the embodiment. The data transmission unit 2 is an electronic circuit which transmits an electric signal (serial data) of the optical transceiver module 1, and includes the above-described integrated circuits and differential transmission lines disposed on a printed circuit board 16.

FPC (Flexible Printed Circuit) connection terminals 17 are disposed at one end of the transmitter-side differential output transmission line 27 of the data transmission unit 2, and the electric output signal is transmitted to the optical transmission element module 6 via the FPC connection terminals 17. In addition, two transmission lines of the differential transmission line 8 are respectively provided with DC cut capacitors 31 and 32. The DC cut capacitors 31 and 32 are, for example, surface-mounted capacitors having the 1005 size of the capacitance value 0.1 μF, and may be omitted if unnecessary. As shown in FIG. 2, DC cut capacitors are also provided at other differential transmission lines as necessary. In addition, in FIG. 2, the receiver-side differential output transmission line 10 is simply shown and has a structure different from an actual structure.

The feature of the present invention lies in a structure of the differential transmission line 8. The optical transceiver module 1 includes the transmitter and receiver integration type CDR integrated circuit 3, and an optical input signal and an optical output signal are input to and output from the transmitter and receiver integration type CDR integrated circuit 3. In addition, if the optical reception element module 5 and the optical transmission element module 6 are to be disposed so as to be aligned on the optical fiber side, it is necessary for any one of plural differential transmission lines for transmitting the signals to be disposed so as to be bent. The differential transmission line 8 includes a bent region, but has a structure for suppressing a delay time difference which is typically generated in two transmitted differential signals.

Figure 3:
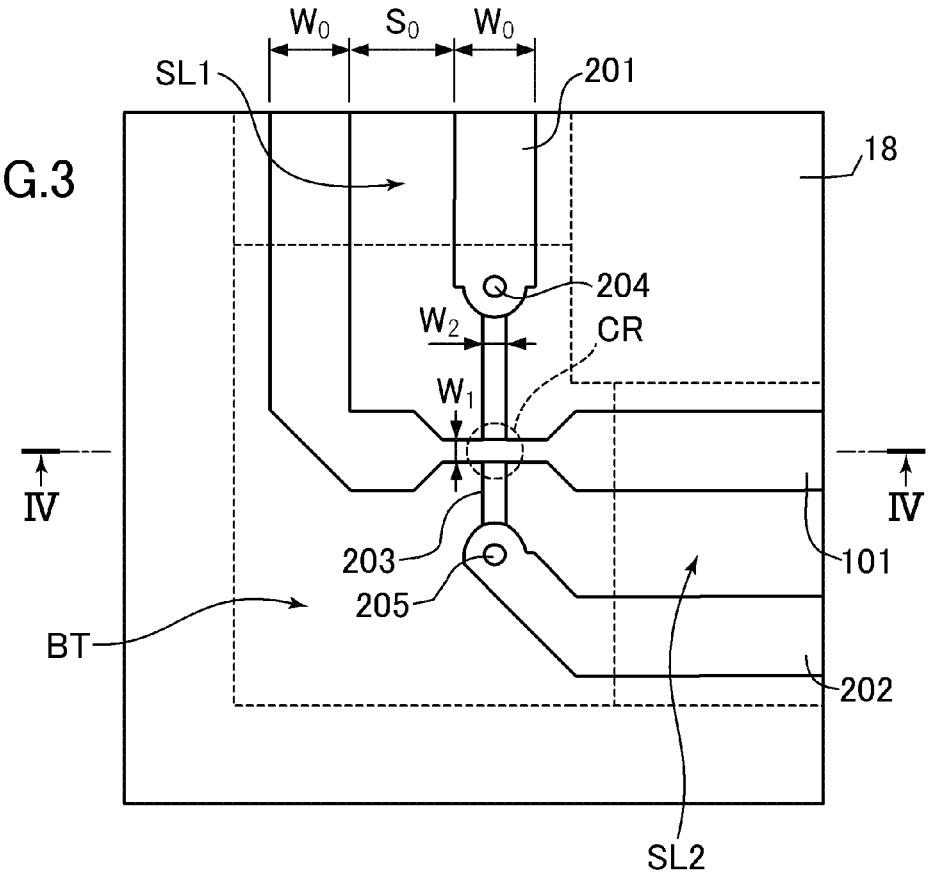
FIG. 3 is a top view illustrating a vicinity of the bent region in the differential transmission line according to the first embodiment of the present invention.

FIG. 3 is a top view illustrating the vicinity of the bent region of the differential transmission line 8 according to the embodiment. FIG. 3 is a top view where the region III denoted by the broken lines in FIG. 2 is enlarged. The differential transmission line 8 is formed on the printed circuit board 16, and, in FIG. 3, a bent region BT of the differential transmission line 8, and a first straight line region SL1 and a second straight line region SL2 adjacent to both ends thereof are shown.

In the differential transmission line 8, a ground conductor layer 18 and a pair of (two) transmission line conductors form a pair of (two) transmission lines. Here, it is assumed that a pair of transmission line conductors are respectively a first transmission line conductor and a second transmission line conductor, a first transmission line is formed of the first transmission line conductor and the ground conductor layer 18, and a second transmission line is formed of the second transmission line conductor and the ground conductor layer 18. A positive transmission signal (P data) and a negative transmission signal (N data) are respectively transmitted on a pair of transmission lines, and a potential difference of the positive transmission signal with respect to the negative transmission signal is a signal level. Here, for convenience, the first transmission line conductor is referred to as a P data transmission line conductor for transmitting a positive transmission signal, and the second transmission line conductor is referred to as an N data transmission line conductor for transmitting a negative transmission signal, but the embodiment is not limited thereto.

The ground conductor layer 18 does not have slits even in the bent region BT unlike in the ground conductor layer disclosed in Japanese Patent No. 3954641. In other words, the ground conductor layer 18 includes regions opposite to a pair of transmission line conductors and is formed so as to spread outside the region. FIG. 3 shows a case where the ground conductor layer 18 has a shape spreading on one surface.

In FIG. 3, the first transmission line conductor is indicated by a first upper layer P data conductor film 101, the second transmission line conductor is indicated by a first upper layer N data conductor film 201, a second upper layer N data conductor film 202, a first lower layer N data conductor film 203, a first via hole 204, and a second via hole 205. As shown in FIG. 3, a pair of transmission line conductors is classified into the first straight line region SL1, the bent region BT, and the second straight line region SL2 depending on its shape. In the first straight line region SL1, a pair of transmission line conductors extends together downward (in a first direction) in parallel to each other with the width W0 which is a first width. In the second straight line region SL2, a pair of transmission line conductors extends together rightward (in a second direction) in parallel to each other with the width W0 which is a second width. The bent region BT is a region adjacent to the first straight line region SL1 and the second straight line region SL2, and includes a cross region CR (first cross region) where a pair of transmission line conductors crosses each other in a three-dimensional manner via a dielectric layer 23 (not shown). In the cross region CR, a pair of transmission line conductors is perpendicular to each other when viewed from the upper side of the ground conductor layer 18.

In addition, an electric output signal is transmitted on the differential transmission line 8 from the transmitter and receiver integration type CDR integrated circuit 3 to the driving integrated circuit 4 as a differential signal, and, for convenience, the traveling direction side is referred to as a front side, and a reverse direction to the traveling direction is referred to as a rear side according to the traveling side of the electric output signal. However, needless to say, the present invention can be described even if the reverse direction to the traveling direction is referred to as a front side, and the traveling direction is referred to as a rear side. That is to say, the cross region CR is disposed on the front side of the first straight line region SL1, and the second straight line region SL2 is disposed on the front side of the cross region CR. In addition, the first via hole 204 is disposed between the first straight line region SL1 and the cross region CR, and the second via hole 205 is disposed on the front side of the cross region CR and between the cross region CR and the second straight line region SL2.

First, the first transmission line conductor will be described. The first transmission line conductor (the first upper layer P data conductor film 101) is formed over the ground conductor layer 18 via the dielectric layer 23 (not shown). Here, the layer in which the first upper layer P data conductor film 101 is formed is referred to as a first layer. The first transmission line conductor (the first upper layer P data conductor film 101) linearly extends downward (in the first direction) with the width W0 which is the first width in the first straight line region SL1, and further linearly extends in the bent region BT. In addition, the first transmission line conductor (the first upper layer P data conductor film 101) is bent by 90 degrees rightward from downward (in the second direction from the first direction) on the rear side of the cross region CR in the bent region BT, that is, between the first straight line region SL1 and the cross region CR, and further extends rightward (in the second direction) with the width W0. Here, a notch called a mitre is provided at the corner of the portion which is bent by 90 degrees in order to suppress capacitance which occurs between the first upper layer P data conductor film 101 and the ground conductor layer 18 from being increased in the bent portion. In addition, in the bent region BT, the first transmission line conductor (the first upper layer P data conductor film 101) becomes gradually smaller from the width W0 to the width W1, linearly extends so as to pass the cross region CR rightward with the width W1, and then becomes gradually larger from the width W1 to the width W0. Further, the first transmission line conductor (the first upper layer P data conductor film 101) extends to the second straight line region SL2, and linearly extends rightward (in the second direction) with the width W0 which is the second width in the second straight line region SL2.

Next, the second transmission line conductor will be described. The first upper layer N data conductor film 201 and the second upper layer N data conductor film 202 are formed together in the first layer which is the same layer as the first upper layer P data conductor film 101. In contrast, the first lower layer N data conductor film 203 is located on the lower side than the upper conductor films and is formed over the ground conductor layer 18. Here, if the layer in which the first lower layer N data conductor film 203 is formed is referred to as a second layer, the second layer is a lower layer than the first layer but is not limited thereto, and may be an upper layer than the first layer. The end part of the first upper layer N data conductor film 201 and the upper end part of the first lower layer N data conductor film 203 overlap each other in a planar manner, and are electrically connected to each other via the first via hole 204. Similarly, the end part of the second upper layer N data conductor film 202 and the lower end part of the first lower layer N data conductor film 203 overlap each other in a planar manner, and are electrically connected to each other via the second via hole 205.

The second transmission line conductor (the first upper layer N data conductor film 201) is parallel to the first upper layer P data conductor film 101 on the right side of the first transmission line conductor (the first upper layer P data conductor film 101) and linearly extends downward (in the first direction) in the first layer with the width W0 which is the first width in the first straight line region SL1, and further extends in the first layer so as to reach the first via hole 204 in the bent region BT. In the first straight line region SL1, the gap between the first upper layer P data conductor film 101 and the first upper layer N data conductor film 201 is a width S0. In other words, a distance between the right edge of the first upper layer P data conductor film 101 and the left edge of the first upper layer N data conductor film 201 is the width S0.

The second transmission line conductors penetrates through the first via hole 204 from the first layer to the second layer in the bent region BT, and further the second transmission line conductor (the first lower layer N data conductor film 203) passes through the cross region CR with the width W2 and linearly extends downward in the second layer between the first via hole 204 and the second via hole 205. In addition, the second transmission line conductor penetrates through the second via hole 205 from the second layer to the first layer. Further, the second transmission line conductor (the second upper layer N data conductor film 202) extends toward the lower right from the second via hole 205 in the first layer, is bent rightward from the lower right, and extends rightward to the second straight line region SL2. Here, the second transmission line conductor is bent by 90 degrees rightward from the downward (in the second direction from the first direction) in the bent region BT and on the front side of the cross region CR, that is, between the cross region CR and the second straight line region SL2. In addition, in the second straight line region SL2, the second transmission line conductor (the second upper layer N data conductor film 202) is parallel to the first upper layer P data conductor film 101 on the lower side of the first transmission line conductor (the first upper layer P data conductor film 101), and linearly extends rightward (in the second direction) in the first layer with the width W0 which is the second width. In the second straight line region SL2, a gap between the first upper layer P data conductor film 101 and the second upper layer N data conductor film 202 is the width S0.

In the differential transmission line 8 according to the embodiment is bent by 90 degrees rightward from the downward (in the second direction from the first direction) in the bent region BT. Here, the direction of the variation in the bent direction rightward from the downward (in the second direction from the first direction) is a clockwise direction. The first transmission line conductor (one transmission line conductor) of a pair of transmission line conductors is the outer transmission line conductor (the left side of the figure) in the first straight line region SL1 and is the inner transmission line conductor (the upper side of the figure) in the second straight line region SL2 with respect to the clockwise direction which is the direction of the variation in the bent direction. In contrast, the second transmission line conductor (the other transmission line conductor) is the inner transmission line conductor (the right side of the figure) in the first straight line region SL1 and is the outer transmission line conductor (the lower side of the figure) in the second straight line region SL2.

The first transmission line conductor (one transmission line conductor) is the outer transmission line conductor in the first straight line region SL1, and only the first transmission line conductor is bent rightward from the downward (in the second direction from the first direction) between the first straight line region SL1 and the cross region CR. At this time, the second transmission line conductor (the other transmission line conductor) passes the cross region CR from the first straight line region SL1 and linearly extends downward (in the first direction) to the second via hole 205. The first transmission line conductor passes the cross region CR further rightward (in the second direction) and linearly extends, crosses the second transmission line conductor (the first lower layer N data conductor film 203) in a three-dimensional manner in the cross region CR, linearly extends further rightward (in the second direction), and becomes the inner transmission line conductor in the second straight line region SL2. In contrast, the second transmission line conductor (the other transmission line conductor) is the inner transmission line conductor in the first straight line region SL1, and crosses the first transmission line conductor (the first upper layer P data conductor film 101) in a three-dimensional manner in the cross region CR. In addition, only the second transmission line conductor (the other transmission line conductor) is bent rightward from the downward (in the second direction from the first direction) between the cross region CR and the second straight line region SL2. At this time, the first transmission line conductor (the one transmission line conductor) passes the cross region CR, and linearly extends rightward (in the second direction) toward the second straight line region SL2. Further, the second transmission line conductor (the other transmission line conductor) becomes the outer transmission line conductors in the second straight line region SL2.

Generally, in order to suppress reflection loss in the differential transmission line, a cross-sectional shape of the differential transmission line is preferably the same in as many regions as possible, and a differential transmission line having a desired wire length is formed such that the straight line region in which a pair of transmission line conductors linearly extends on the same layer at the same width is longer, and the bent region having the cross-sectional shape different from that of the straight line region is shorter. Therefore, in the differential transmission line 8 according to the embodiment, in the bent region BT, only the first transmission line conductor is bent rightward from the downward (in the second direction from the first direction) on the rear side of the cross region, and only the second transmission line conductor is bent rightward from the downward (in the second direction from the first direction) on the front side of the cross region CR. However, the present invention is not limited to this example, and a pair of transmission line conductors may be bent together on the rear side (or front side) of the cross region CR as necessary such as circumstances in design of the differential transmission line. In addition, from the viewpoint of higher density mounting or characteristic deterioration of differential signals in the cross region CR, an angle formed by the first transmission line conductor and the second transmission line conductor in a planar manner when viewed from the upper side of the ground conductor layer 18 is preferably as large as possible, for example, 80 degrees or more. It is further preferable that the first transmission line conductor and the second transmission line conductor cross each other so as to be perpendicular to each other in a planar manner.

In addition, although the first transmission line conductor which is the outer transmission line conductor (one transmission line conductor) in the first straight line region SL1 is a transmission line conductor (first transmission line conductor of the pair of transmission line conductors) formed in the first layer in the cross region CR, the present invention is not limited thereto, the second transmission line conductor may be formed in the first layer in the cross region CR.

Both the first transmission line and the second transmission line preferably extend with desired characteristic impedance, and therefore a pair of transmission line conductors preferably has the same width W0 in the straight line regions. Here, the width W0 is 0.39 mm. In addition, in the straight line regions, the first transmission line conductor and the second transmission line conductor preferably extend such that a gap therebetween is the same width S0. Here, the width S0 is 0.515 mm.

The first transmission line conductor and the second transmission line conductor cross each other in a three-dimensional manner in the cross region CR. The width W1 of the first transmission line conductor (the first upper layer P data conductor film 101) in the cross region CR is preferably smaller than the width W0 which is the first width of the first transmission line conductor (the first upper layer P data conductor film 101) in the first straight line region SL1, and, here, the width W1 is 0.11 mm. In a similar manner, the width W2 of the second transmission line conductor (the first lower layer N data conductor film 203) in the cross region CR is preferably smaller than the width W0 which is the first width of the second transmission line conductor (the first upper layer N data conductor film 201) in the first straight line region SL1, and, here, the width W2 is 0.11 mm.

As described above, the first lower layer N data conductor film 203 is electrically connected to the first upper layer N data conductor film 201 and the second upper layer N data conductor film 202 via the first via hole 204 and the second via hole 205, respectively. Here, the first via hole 204 and the second via hole 205 are laser via holes using a via hole formed through a laser process, and each of the diameters of the first via hole 204 and the second via hole 205 is 0.1 mm. In addition, needless to say, the via holes may be formed through other processes.

Figure 4:
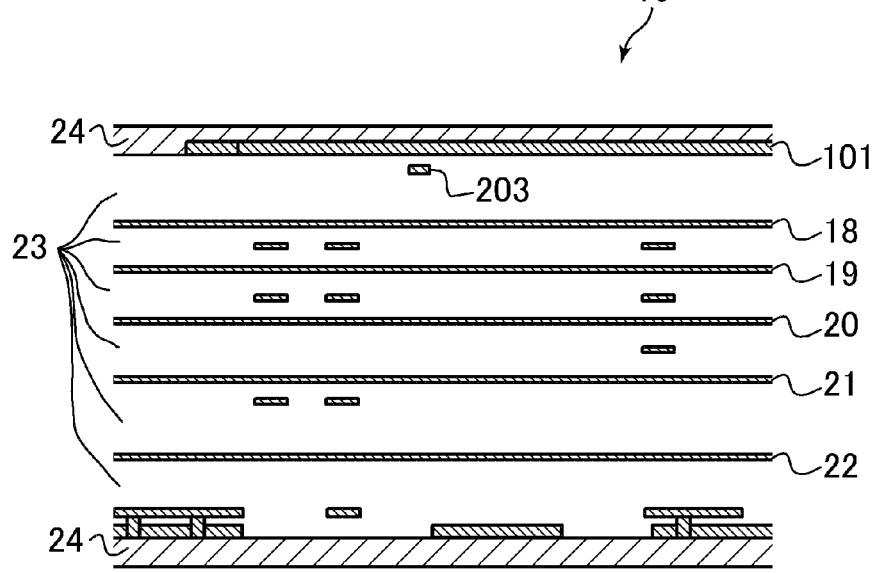
FIG. 4 is a cross-sectional view of the printed circuit board taken along the line IV-IV in FIG. 3.

FIG. 4 is a cross-sectional view of the printed circuit board 16 taken along the line IV-IV in FIG. 3, and shows a vertical structure of the printed circuit board 16. A pair of transmission line conductors are provided together on one side (the upper side of FIG. 4) of the ground conductor layer 18 via the dielectric layer 23. In FIG. 4, the first transmission line conductor is indicated by the first upper layer P data conductor film 101, and the second transmission line conductor is indicated by the first lower layer N data conductor film 203 which crosses the first transmission line conductor in a three-dimensional manner in the cross region CR. The printed circuit board 16 is a multi-layer board formed by a build-up method, and a pair of transmission line conductors are provided in the surface of the printed circuit board 16 on the upper side of the figure. Here, the dielectric layer 23 is provided on the surface of the ground conductor layer 18. The first upper layer P data conductor film 101 is provided on the surface of the dielectric layer 23, and the first lower layer N data conductor film 203 is provided inside the dielectric layer 23 and over the ground conductor layer 18.

Mounted components may be disposed on the lower side of the ground conductor layer 18 of the printed circuit board 16 in the figure. Plural ground conductor layers 19, 20, 21 and 22 are further disposed, and wires formed from a conductor are provided between the ground conductor layers adjacent to each other. A material made of a glass fabric base and an epoxy resin is used for the dielectric layer 23, and, here, the relative permittivity thereof is 3.6. In addition, as a dimension in the vertical direction of the printed circuit board 16, a gap between the ground conductor layer 18 and the first layer (the first upper layer P data conductor film 101, the first upper layer N data conductor film 201, and the second upper layer N data conductor film 202) is here 0.279 mm, and a gap between the ground conductor layer 18 and the second layer (the first lower layer N data conductor film 203) is 0.192 mm. Each conductor film is formed by patterning laminated copper foils. The thickness of the first layer is 0.053 mm, and the thickness of the second layer is 0.033 mm.

Protective layers 24 are disposed on both the surfaces of the printed circuit board 16. The protective layers 24 are protective films called a solder resist, and may be omitted if unnecessary. Here, the protective layers 24 use a material with the permittivity 4.4, and the thickness of each of the protective layers 24 is 0.082 mm.

As above, the configuration of the differential transmission line 8 according to the embodiment has been described. The differential transmission line according to the embodiment of the present invention includes the first cross region where a pair of transmission line conductors cross each other in a three-dimensional manner, and since the width of each of a pair of transmission line conductors in the first cross region are smaller than the first width which is a width of each of a pair of transmission line conductors in the first straight line region, a delay time difference occurring in two differential signals is suppressed even in a case where the differential transmission line includes a bent region. Here, although the first transmission line conductor is one transmission line conductor formed in the first layer and the second transmission line conductor is the other transmission line conductor formed in the second layer in the first cross region, the present invention is not limited thereto, and the first transmission line conductor may be formed in the second layer in the first cross region.

The first via hole is disposed between the first straight line region and the first cross region, the other transmission line conductor (second transmission line conductor) penetrates through the first via hole from the first layer to the second layer, and thereby the other transmission line conductor electrically connects the first straight line region formed in the first layer to the first cross region formed in the second layer. In the bent region and on the rear side of the first cross region, that is, between the first straight line region and the first cross region, at least the outer transmission line conductor in the first straight line region of a pair of transmission line conductors is bent, and thereby a pair of transmission line conductors can cross each other in a three-dimensional manner in the first cross region.

In addition, the second via hole is disposed in the bent region and on the front side of the first cross region, that is, between the first cross region and the second straight line region, the other transmission line conductor penetrates through the second via hole from the second layer to the first layer, and thereby the other transmission line conductor electrically connects the first cross region formed in the second layer to the second straight line region formed in the first layer. In the bent region and on the front side of the first cross region, that is, between the first cross region and the second straight line region, at least the inner transmission line conductor in the first straight line region of a pair of transmission line conductor is bent, and thereby a pair of transmission line conductors can linearly extend in parallel to each other on the front side of the first cross region.

In addition, the outer transmission line conductor in the first straight line region linearly extends in the first direction from the first straight line region, is bent in the second direction from the first direction between the first straight line region and the first cross region, and preferably further linearly extends in the second direction. In a similar manner, the inner transmission line conductor in the first straight line region passes through the first cross region from the first straight line region, linearly extends in the first direction, is bent in the second direction from the first direction on the front side of the first cross region, and preferably further linearly extends in the second direction. Thereby, characteristics of transmission signals transmitted on the differential transmission line are further improved.

A pair of transmission line conductors further include the second straight line region on the front side of the second via hole and is bent in the bent region in the second direction from the first direction, and the differential transmission line extends in the second direction. In addition, the differential transmission line preferably has the same impedance characteristic in the first straight line region and the second straight line region, and the second width which is each of a pair of transmission line conductors in the second straight line region is preferably the same as the first width.

Generally, in a case where a delay time difference occurs in two differential signals in the differential transmission line, the differential mode is converted into an unnecessary common mode during the transmission of the differential signals. If an amount to be converted into the common mode is relatively large, a bandwidth in the differential mode is deteriorated, or signal quality is deteriorated due to occurrence of data-dependent jitter. Although the differential transmission line 8 according to the embodiment has the bent region BT, the conversion of the differential mode into the common mode, occurring when an electric output signal is transmitted from the transmitter and receiver integration type CDR integrated circuit 3 to the driving integrated circuit 4, is suppressed, and thus reflection loss can be suppressed. Further, the ground conductor layer 18 has a shape which spreads on one surface without necessity of providing slots, and thus there is an implementation of a structure where reflection loss in the differential transmission line is suppressed, or noise caused by the differential transmission line is suppressed, thereby implementing the differential transmission line appropriate for high density mounting.

The optical transmission element module 6 according to the embodiment includes the Mach-Zehnder (MZ) modulator. The Mach-Zehnder modulator obtains favorable characteristics in a case where differential signals are driven only in the differential mode, but if there is the common mode, phase shift of output light is generated, and thus quality of optical output signals is considerably deteriorated as the transmission distance is increased, due to the dispersion characteristic of the optical fiber transmission path. However, by the use of the differential transmission line according to the embodiment of the present invention, conversion of the differential mode into the unnecessary common mode is suppressed, and characteristics of optical output signals transmitted by the optical transmission element module 6 are improved.

In addition, the optical transceiver module for optical fiber transmission is intended to achieve high speed, miniaturization, and low costs along with recent popularization of the broadband network, and, in relation to high speed, an optical transceiver module with bit rate of 10 Gbit/s is widely used at present. In relation to miniaturization and lost costs, reduction in a case volume and reduction in the number of components progress from the 300 pin MSA (Multi Source Agreement) specification of the old generation to XENPAK, X2, XFP, and SFP+ (MSA specification). There is an advent of a component for achieving miniaturization and lost costs by integrating a transmitter-side integrated circuit and a receiver-side integrated circuit into one integrated circuit, in components which treat serial data signals such as amplification integrated circuits or CDR integrated circuits. Therefore, the optical transceiver module 1 according to the embodiment includes the transmitter and receiver integration type CDR integrated circuit 3, and, as described above, the differential transmission line according to the embodiment of the present invention is used in places where any of plural differential transmission lines connected to the transmitter and receiver integration type CDR integrated circuit 3 are required to be disposed so as to be bent, thereby improving the characteristics of the optical transceiver module 1.

Figure 26:
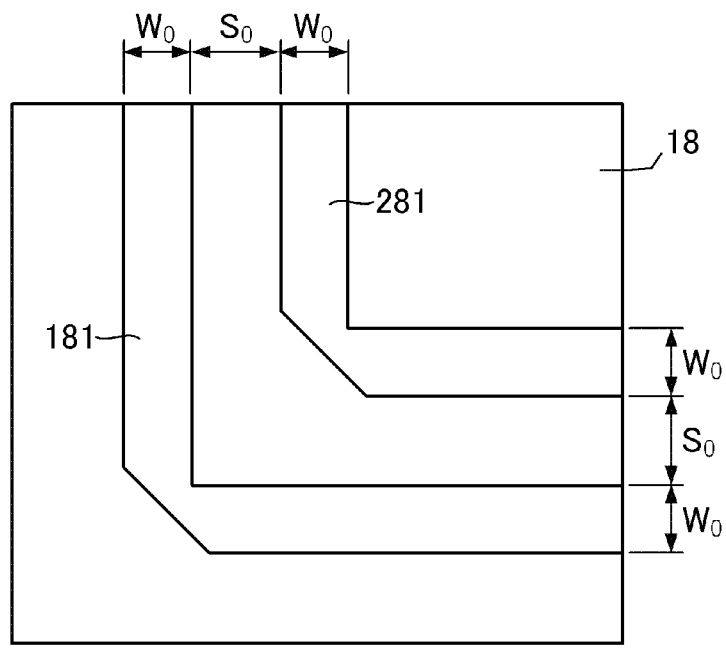
FIG. 26 is a plan view illustrating an example of the differential transmission line according to the related art.

Hereinafter, effects of the differential transmission line 8 according to the embodiment will be described. Here, an example of the differential transmission line having the bent region according to the related art shown in FIG. 26 is referred to as a related example 1. First, the differential transmission line according to the related example 1 as a comparative example of the embodiment will be described.

In a manner similar to the embodiment, in the differential transmission line according to the related example 1, the ground conductor layer 18 and a pair of transmission line conductors form a pair of transmission lines, and, the first transmission line conductor is the P data conductor film 181, and the second transmission line conductor is the N data conductor film 281. Dimensions and materials of the P data conductor film 181 and the N data conductor film 281 are the same as those in the embodiment, the first and second transmission line conductors respectively have the width W0, and a gap between the first and second transmission line conductors is the width S0. In the bent region, the mitre is provided at each of the P data conductor film 181 and the N data conductor film 281, and thus reflection loss is suppressed. A pattern area required to dispose two transmission line conductors related to the related example 1 shown in FIG. 26 is substantially the same as the pattern area required to dispose two transmission line conductors related to the embodiment. However, as described above, the wire length of the P data conductor film 181 which is the first transmission line conductor is larger than the wire length of the N data conductor film 281 which is the second transmission line conductor by $2\times(S0+W0)$, and the delay time difference $\Delta td$ occurs in two differential signals due to a difference between the physical lengths. If the group velocity in each of the transmission lines is denoted by vg, $\Delta td$ is indicated by $\Delta td=2\times(S0+W0)/vg$, and this equation is assumed as (equation 1).

The group velocity vg can be relatively easily calculated from the cross-sectional shape in the straight line region of the transmission line, and $vg=1.7\times10^8$ m/s can be obtained in the differential transmission line according to the related example 1. By substituting S0=0.515 mm and W0=0.39 mm into the (equation 1), the delay time difference $\Delta td$ of 11 ps occurs in two differential signals transmitted on the differential transmission line according to the related example 1.

A differential mode-common mode conversion amount Scd21 caused by the delay time difference $\Delta td$ is calculated through small signal analysis using a circuit simulation tool.

Figure 7:
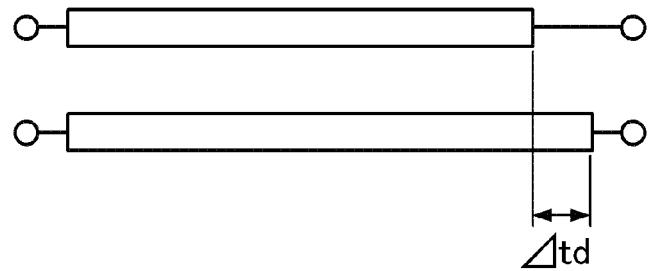
FIG. 7 is a diagram illustrating an ideal transmission line model.

FIG. 7 is a diagram illustrating an ideal transmission line model. In the ideal transmission line model, two transmission lines which linearly extend in parallel to each other are assumed, and both the two transmission lines have the characteristic impedance of 50Ω and are lossless. There is a difference between the wire lengths of the two transmission lines, and a delay time difference caused by the difference between the wire lengths is $\Delta td$. Differential ports are provided at both ends of the two transmission lines shown in FIG. 7 and the small signal analysis is performed, and thereby transmission characteristics of the differential transmission line model formed by the two transmission lines are obtained.

Figure 8:
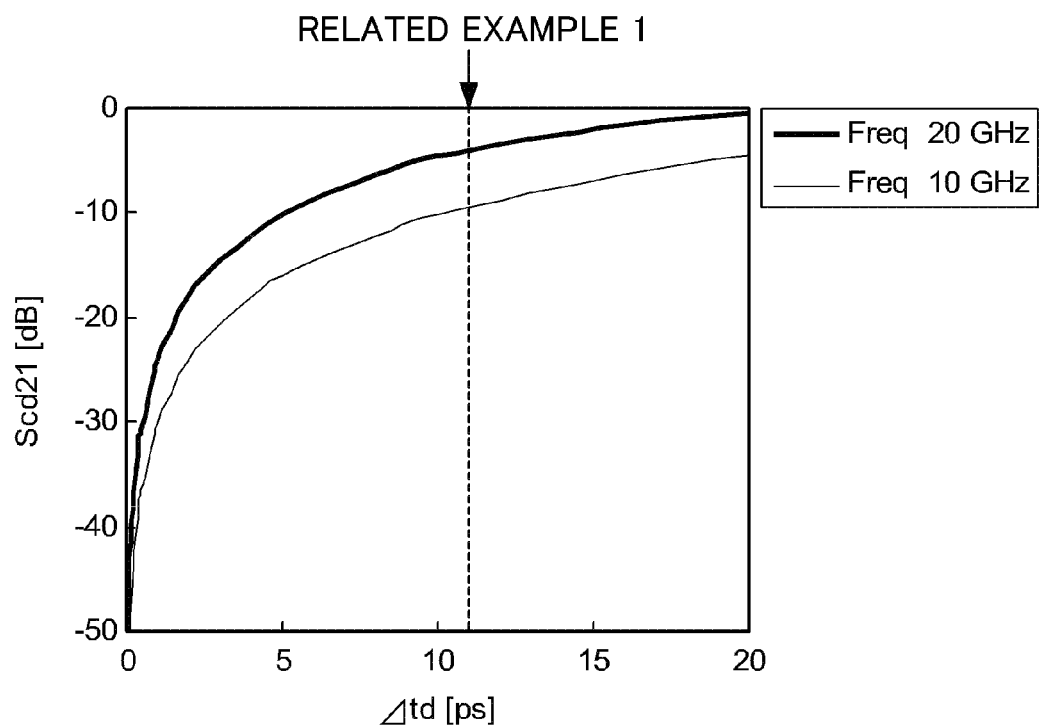
FIG. 8 is a diagram illustrating an analysis result of the ideal transmission line model.

FIG. 8 is a diagram illustrating an analysis result of the ideal transmission line model. FIG. 8 shows a relationship between the delay time difference $\Delta td$ and the differential mode-common mode conversion amount Scd21. Generally, Scd21 is increased according to an increase in the delay time difference $\Delta td$ and an increase in the frequency. In the differential transmission line according to the related example 1, the delay time difference Δtd is 11 ps, and thereby Scd21 is −9.5 dB at the frequency 10 GHz, and −4 dB at the frequency 20 GHz.

Figure 5:
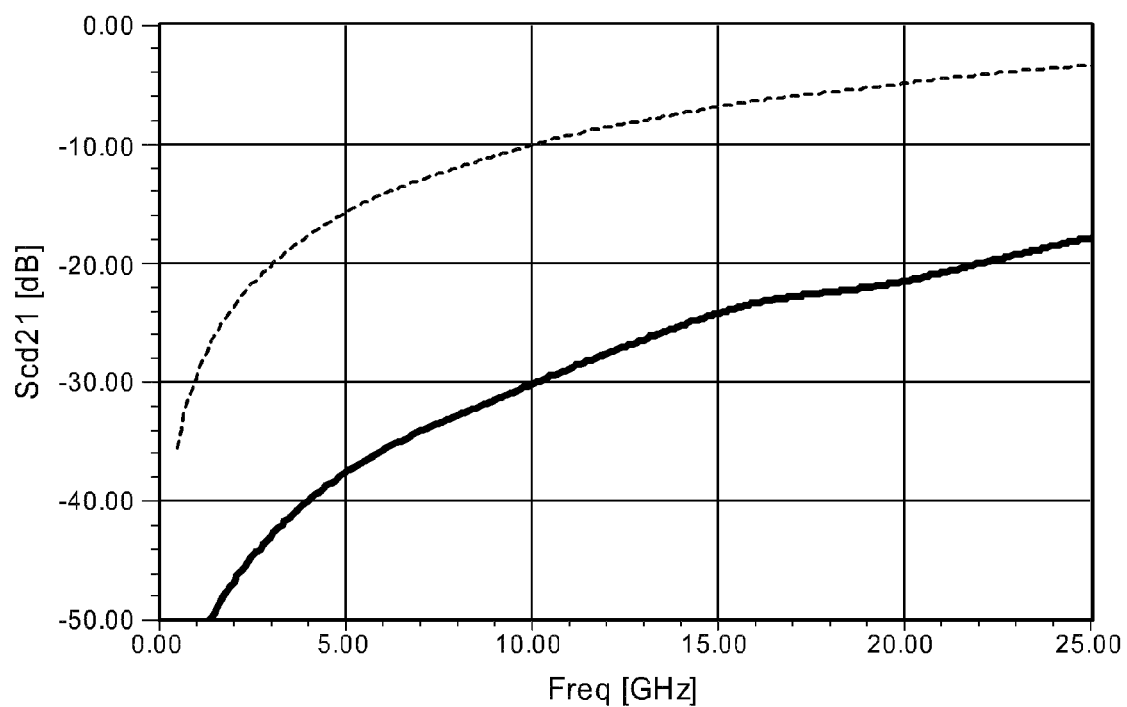
FIG. 5 is a diagram illustrating an analysis result of the differential transmission line according to the first embodiment of the present invention.

In contrast, effects of the differential transmission line 8 according to the embodiment will be described. FIG. 5 is a diagram illustrating an analysis result of the differential transmission line 8 according to the embodiment of the present invention. FIG. 5 shows a result that the differential mode-common mode conversion amount Scd21 of the differential transmission line 8 according to the embodiment is analyzed using a 3D electromagnetic field structure solver, and shows frequency dependency of Scd21. In addition, for comparison, FIG. 5 also shows an analysis result of the differential transmission line according to the related example 1, and the solid line indicates an analysis result according to the embodiment and the broken line indicates an analysis result according to the related example 1.

As shown in FIG. 5, although the differential transmission line 8 according to the embodiment has the bent region BT, Scd21 is suppressed to −30 dB or less in a region of the frequency 10 GHz or less, and −21 dB or less in a region of the frequency 20 GHz or less. As shown in the following Table 1, occurrence of the common mode which is an unnecessary mode is reduced by about 20 dB at the frequency 10 GHz, and by about 17 dB at the frequency 20 GHz as compared with the related example 1.

TABLE 1

| FREQUENCY | RELATED EXAMPLE 1 | FIRST EMBODIMENT |
|---|---|---|
| 10 GHz | −10.1 dB | −30.2 dB |
| 20 GHz | −4.9 dB | −21.5 dB |

Figure 6:
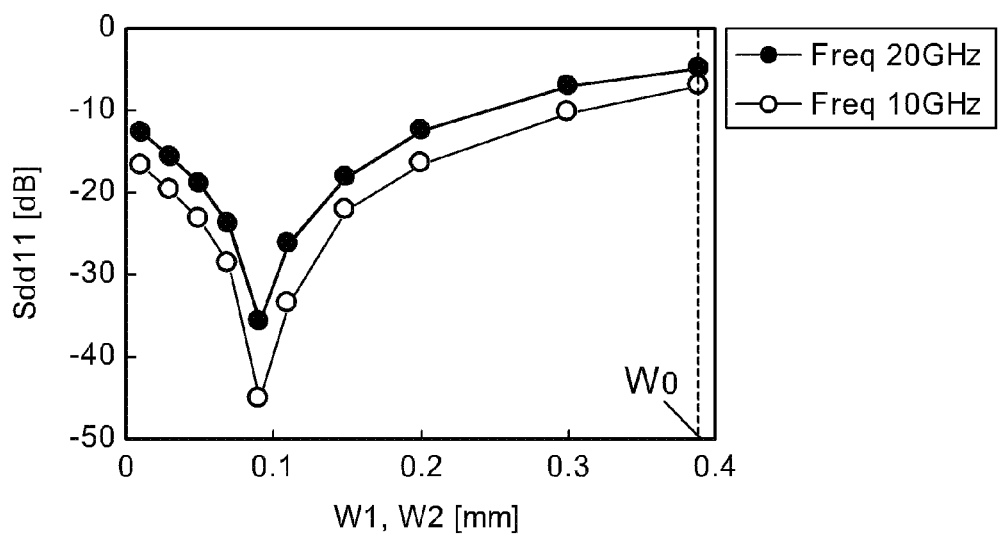
FIG. 6 is a diagram illustrating another analysis result of the differential transmission line according to the first embodiment of the present invention.

FIG. 6 is a diagram illustrating another analysis result of the differential transmission line 8 according to the embodiment of the present invention. FIG. 6 shows an analysis result of the differential reflection coefficient Sdd11 using the width W1 of the first transmission line conductor (the first upper layer P data conductor film 101) and the width W2 of the second transmission line conductor (the first lower layer N data conductor film 203) in the cross region CR of the differential transmission line 8 as parameters. Here, the width W1 and the width W2 have the same value, and the width W1 and the width W2 are varied in a range of 0.39 mm to 0.01 mm, thereby analytically obtaining Sdd11 at each of the width W1 (the width W2). In addition, 0.39 mm is the same value as the width W0 of the first and second transmission line conductors in the straight line regions.

As shown in FIG. 6, if the width W1 (the width W2) is smaller than the width W0, influence of discontinuity of the characteristic impedance in the cross region CR is reduced, and thus Sdd11 is reduced. As shown in FIG. 6, when the width W1 and the width W2 are 0.09 mm, the reduction in Sdd11 is notable at the frequency of 10 GHz and 20 GHz for both the two. In addition, each of the width W1 and the width W2 of the differential transmission line 8 according to the embodiment is 0.11 mm, and Sdd11 is notably reduced. As −33 dB at the frequency 10 GHz and −26 dB at the frequency 20 GHz, favorable Sdd11 is realized. Further, the width W1 and the width W2 are not limited to these values and are preferably set to be smaller than the width W0 in the straight line regions, and the differential transmission line 8 can be easily designed so as to suppress reflection loss using values of the width W1 and the width W2 as adjustment parameters.

In addition, in the bent region BT of the differential transmission line 8 shown in FIG. 3, the second upper layer N data conductor film 202 linearly extends toward the lower right from the second via hole 205 to the second straight line region SL2. Here, wire lengths of transmission line conductors which are measured in a planar manner when viewed from the upper side of the ground conductor layer 18 are assumed. Since the second upper layer N data conductor film 202 has the shape shown in FIG. 3, in relation to the wire lengths of a pair of transmission line conductors of the differential transmission line 8, the first transmission line conductor (first transmission line conductor of the pair of transmission line conductors) is longer than the second transmission line conductor (second transmission line conductor of the pair of transmission line conductors). The second transmission line conductor has the first via hole 204 and the second via hole 205, and thus the effective wire length of the second transmission line conductor is larger than the wire length which is measured from the planar shape due to the thicknesses of the first via hole 204 and the second via hole 205. Therefore, the shape of the second upper layer N data conductor film 202 is formed in consideration of this fact. In other words, an increase in the delay time occurring when an electric output signal is transmitted on the first via hole 204 and the second via hole 205 (an increase in the delay time caused by the thicknesses of the via holes) is compensated for by the shape of the second upper layer N data conductor film 202 without an increase in the pattern area.

[Second Embodiment]

A basic configuration of the optical transceiver module 1 according to the second embodiment of the present invention is the same as the configuration of the optical transceiver module 1 according to the first embodiment, but shapes of a pair of transmission line conductors of the differential transmission line 8 according to the embodiment are different from those in the first embodiment.

Figure 9:
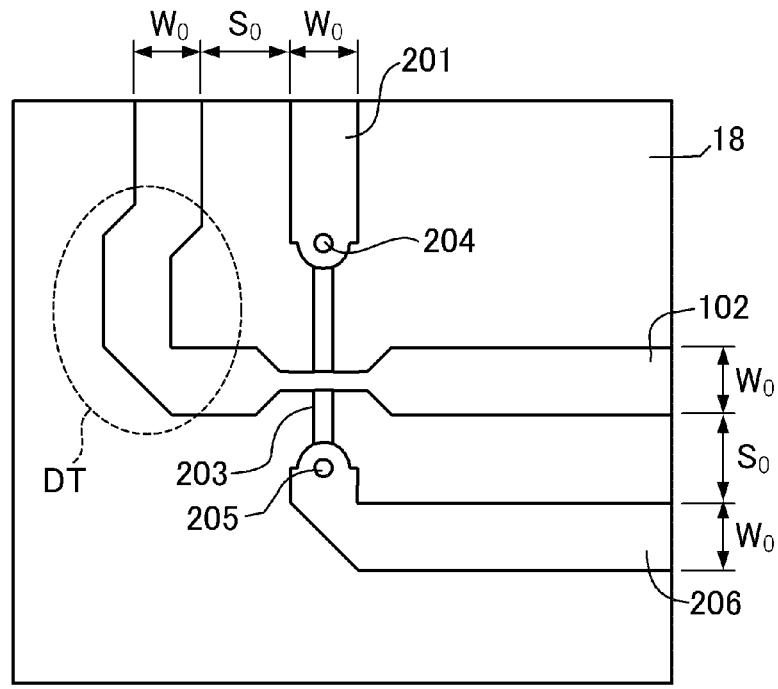
FIG. 9 is a top view illustrating a vicinity of a bent region of a differential transmission line according to a second embodiment of the present invention.

FIG. 9 is a top view illustrating the vicinity of the bent region of the differential transmission line 8 according to the embodiment. A pair of transmission line conductors are shown in the same manner as the differential transmission line 8 according to the first embodiment shown in FIG. 3. In FIG. 9, the first transmission line conductor is shown by a first upper layer P data conductor film 102, and the second transmission line conductor is shown by a first upper layer N data conductor film 201, a second upper layer N data conductor film 206, a first lower layer N data conductor film 203, a first via hole 204, and a second via hole 205.

A shape of the second upper layer N data conductor film 206 shown in FIG. 9 is different from the shape of the second upper layer N data conductor film 202 shown in FIG. 3. The shape of the portion which is bent by 90 degrees in the second upper layer N data conductor film 206 shown in FIG. 9 is the same as the shape of the portion which is bent by 90 degrees in the first upper layer P data conductor film 101 shown in FIG. 3, and the second upper layer N data conductor film 206 has a mitre provided at the portion which is bent by 90 degrees. Therefore, if the first transmission line conductor is the first upper layer P data conductor film 101 shown in FIG. 3, an increase in the delay time caused by the thicknesses of the first via hole 204 and the second via hole 205 occurs in a differential signal transmitted on the second transmission line conductor. However, the first transmission line conductor according to the embodiment has the shape of the first upper layer P data conductor film 102 shown in FIG. 9, and includes a detour region DT which detours and extends. Since the first transmission line conductor has the detouring and extending portion such that the detour region DT of the first transmission line conductor projects toward the left side of the figure, the first transmission line conductor is longer than the second transmission line conductor in relation to the wire lengths of the transmission line conductors which are measured in a planar manner when viewed from the upper side of the ground conductor layer 18. The detour region DT of the first transmission line conductor compensates for an increase in the delay time caused by the thicknesses of the first via hole 204 and the second via hole 205.

In the differential transmission line 8 according to the embodiment, the detour region DT causes an increase in the pattern area, but the increase in the pattern area is considerably suppressed as compared with an increase in the pattern area occurring when the differential transmission line according to the related art has a shape where other regions are partially meandered in order to compensate for an increase in the delay time occurring in the bent region in a case where a pair of transmission line conductors do not have the cross region CR. In addition, in the differential transmission line 8 according to the first embodiment, the second transmission line conductor is shorter than the first transmission line conductor through examination of a shape of the second transmission line conductor (the second upper layer N data conductor film 202) in relation to the wire lengths of the transmission line conductors measured in a planar manner, but there is a limitation on a delay time which can be compensated by a shape of the second transmission line conductor. On the contrary, in relation to the wire lengths of the transmission line conductors measured in a planar manner, the first transmission line conductor is longer than the second transmission line conductor due to the shape of the detour region DT according to the embodiment, but a longer delay time can be compensated for and a degree of freedom of design is heightened by the shape of the first transmission line conductor.

Figure 10:
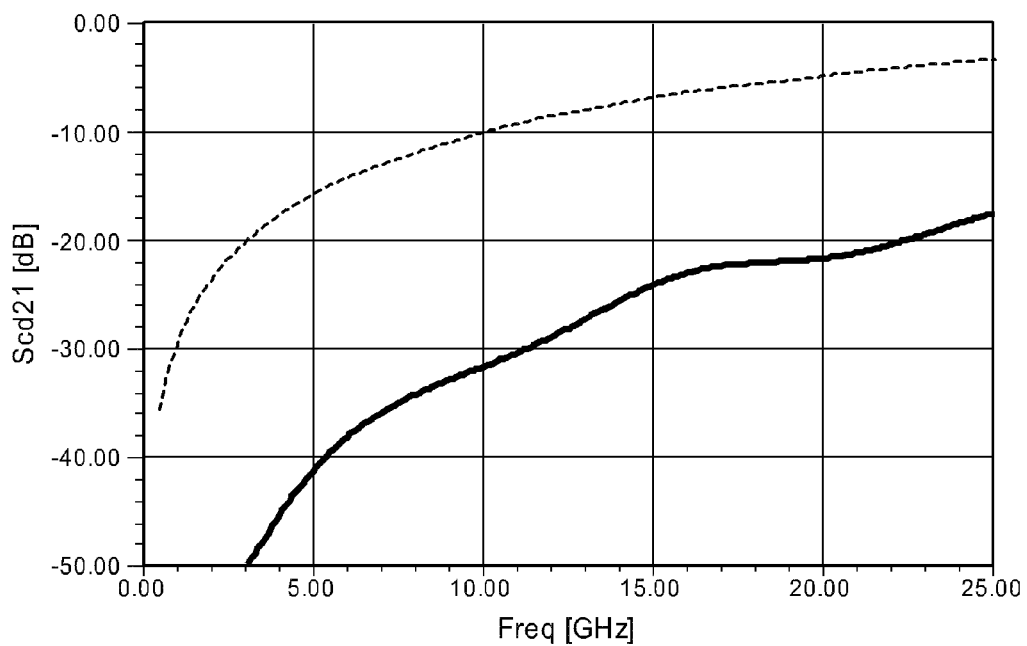
FIG. 10 is a diagram illustrating an analysis result of the differential transmission line according to the second embodiment of the present invention.

FIG. 10 is a diagram illustrating an analysis result of the differential transmission line 8 according to the embodiment of the present invention. FIG. 10 shows frequency dependency of the differential mode-common mode conversion amount Scd21 of the differential transmission line 8 according to the embodiment in the same manner FIG. 5. In addition, for comparison, in the same manner as FIG. 5, FIG. 10 also shows an analysis result of the differential transmission line according to the related example 1, and the solid line indicates an analysis result according to the embodiment and the broken line indicates an analysis result according to the related example 1.

As shown in FIG. 10, although the differential transmission line 8 according to the embodiment has the bent region, Scd21 is suppressed to −31 dB or less in a region of the frequency 10 GHz or less, and −21 dB or less in a region of the frequency 20 GHz or less. As shown in the following Table 2, occurrence of the common mode which is an unnecessary mode is reduced by about 22 dB at the frequency 10 GHz, and by about 17 dB at the frequency 20 GHz as compared with the related example 1.

TABLE 2

| FREQUENCY | RELATED EXAMPLE 1 | SECOND EMBODIMENT |
| --- | --- | --- |
| 10 GHz | −10.1 dB | −31.6 dB |
| 20 GHz | −4.9 dB | −21.6 dB |

[Third Embodiment]

A basic configuration of the optical transceiver module 1 according to the third embodiment of the present invention is the same as the configuration of the optical transceiver module 1 according to the second embodiment, but shapes of a pair of transmission line conductors of the differential transmission line 8 according to the embodiment are different from those in the second embodiment.

Figure 11:
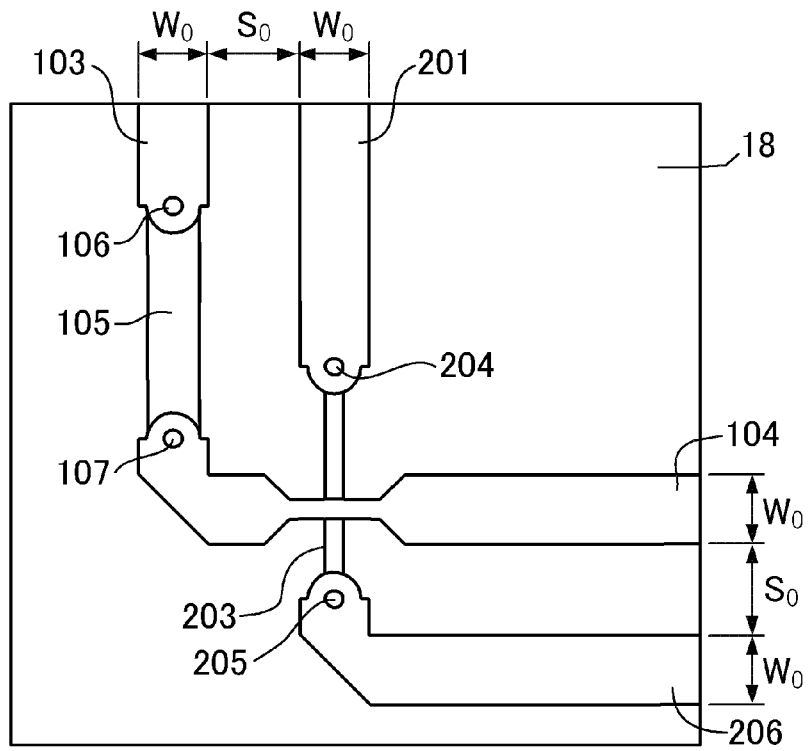
FIG. 11 is a top view illustrating a vicinity of a bent region of a differential transmission line according to a third embodiment of the present invention.

FIG. 11 is a top view illustrating the vicinity of the bent region of the differential transmission line 8 according to the embodiment. A pair of transmission line conductors are shown in the same manner as the differential transmission line 8 according to the second embodiment shown in FIG. 9. The second transmission line conductor shown in FIG. 11 has the same configuration as that of the second transmission line conductor shown in FIG. 9. In contrast, in FIG. 11, the first transmission line conductor is shown by a first upper layer P data conductor film 103, a second upper layer P data conductor film 104, a first lower layer P data conductor film 105, a third via hole 106, and a fourth via hole 107.

The second upper layer N data conductor film 206 shown in FIG. 11 has the same shape as the second upper layer N data conductor film 206 shown in FIG. 9, and has a mitre provided at the portion which is bent by 90 degrees. Therefore, if the first transmission line conductor is the first upper layer P data conductor film 101 shown in FIG. 3, an increase in the delay time caused by the thicknesses of the first via hole 204 and the second via hole 205 occurs in a differential signal transmitted on the second transmission line conductor. However, the first transmission line conductor (first transmission line conductor of the pair of transmission line conductors) according to the embodiment further includes the third via hole 106 and the fourth via hole 107, and the first transmission line conductor (the first upper layer P data conductor film 103) extends downward to the third via hole 106 in the first layer, the first transmission line conductors penetrates through the third via hole 106 from the first layer to the second layer, the first transmission line conductor (the first lower layer P data conductor film 105) extends downward from the third via hole 106 to the fourth via hole 107, the first transmission line conductor penetrates through the fourth via hole 107 from the second layer to the first layer, and the first transmission line conductor (the second upper layer P data conductor film 104) further extends toward the front side in the first layer as shown in FIG. 11. That is to say, the shape of the second upper layer P data conductor film 104 corresponds with the bent region BT of the first upper layer P data conductor film 101 and the second straight line region SL2 shown in FIG. 3 except for the vicinity of the end portion of the fourth via hole 107 side of the second upper layer P data conductor film 104.

In the differential transmission line according to the embodiment, two via holes are disposed at each of a pair of transmission line conductors, and thus an increase in the delay time caused by the thicknesses of the two via holes occurs in each of a pair of transmission line conductors, thereby suppressing a delay time difference occurring in two differential signals. Here, although the distance between the third via hole 106 and the fourth via hole 107 is the same as the distance between the first via hole 204 and the second via hole 205, the present invention is not limited thereto. In addition, here, although the first lower layer P data conductor film 105 is provided on the rear side of the cross region CR, the present invention is not limited thereto, the first lower layer P data conductor film 105 may be provided on the front side of the cross region CR.

Generally, the film thickness of the dielectric layer 23 may be varied due to a manufacturing error in a process of forming the dielectric layer 23. If the film thickness of the dielectric layer 23 is varied, the thickness of the via hole is also varied accordingly, and thus a delay time caused by the thickness of the via hole is also varied. In a case where a delay time is compensated for by the shape of the transmission line conductors, it is difficult to handle the variation in the film thickness of the dielectric layer 23 due to the manufacturing error. However, in the differential transmission line 8 according to the embodiment, a delay time caused by the two via holes of the second transmission line conductor is compensated for by increasing a delay time caused by the two via holes of the first transmission line conductor. Therefore, even if the film thickness of the dielectric layer 23 is varied, the film thicknesses of the via holes of each of a pair of transmission line conductors are evenly varied accordingly, and thus a delay time difference is suppressed so as to handle the variation in the film thickness of the dielectric layer 23 due to the manufacturing error. In addition, the first lower layer P data conductor film 105 is formed with a width where the first transmission line has desired characteristic impedance. Here, the width of the first lower layer P data conductor film 105 is 0.29 mm, which is appropriate at this time in terms of reducing differential reflection loss.

Figure 12:
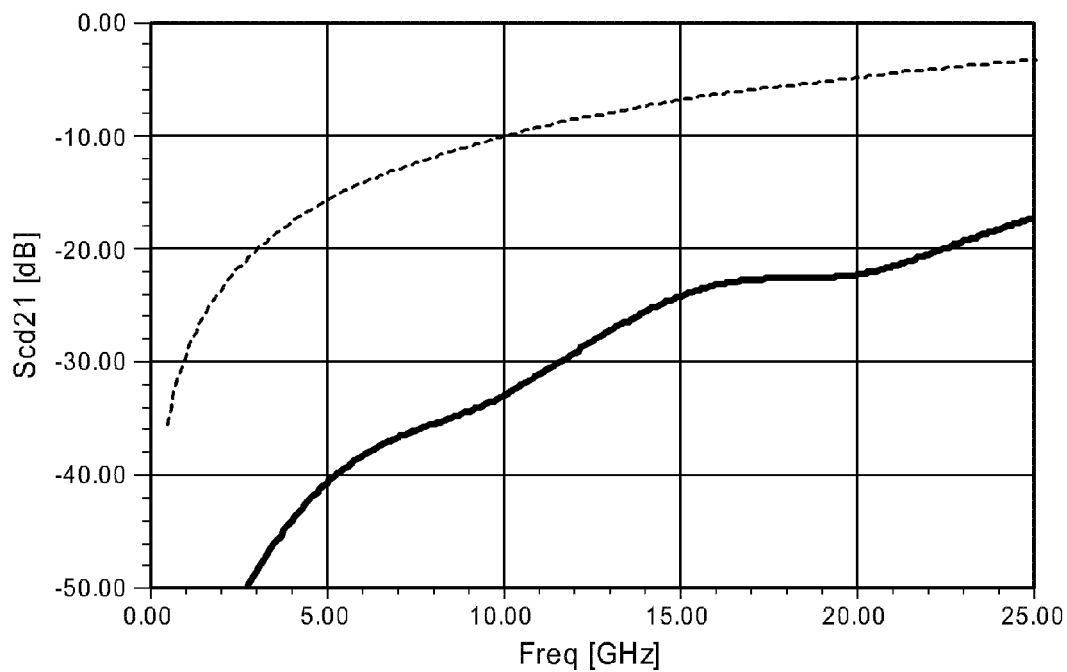
FIG. 12 is a diagram illustrating an analysis result of the differential transmission line according to the third embodiment of the present invention.

FIG. 12 is a diagram illustrating an analysis result of the differential transmission line 8 according to the embodiment of the present invention. FIG. 12 shows frequency dependency of the differential mode-common mode conversion amount Scd21 of the differential transmission line 8 according to the embodiment in the same manner FIG. 5. In addition, for comparison, in the same manner as FIG. 5, FIG. 12 also shows an analysis result of the differential transmission line according to the related example 1, and the solid line indicates an analysis result according to the embodiment and the broken line indicates an analysis result according to the related example 1.

As shown in FIG. 12, although the differential transmission line 8 according to the embodiment has the bent region, Scd21 is suppressed to −32 dB or less in a region of the frequency 10 GHz or less, and −22 dB or less in a region of the frequency 20 GHz or less. As shown in the following Table 3, occurrence of the common mode which is an unnecessary mode is reduced by about 23 dB at the frequency 10 GHz, and by about 17 dB at the frequency 20 GHz as compared with the related example 1.

TABLE 3

| FREQUENCY | RELATED EXAMPLE 1 | THIRD EMBODIMENT |
|---|---|---|
| 10 GHz | −10.1 dB | −32.9 dB |
| 20 GHz | −4.9 dB | −22.3 dB |

[Fourth Embodiment]

A basic configuration of the optical transceiver module 1 according to the fourth embodiment of the present invention is the same as the configuration of the optical transceiver module 1 according to the first embodiment, but the optical transceiver module 1 according to the embodiment includes an SerDes (SERializer/DESerializer) integrated circuit 25, and shapes of a pair of transmission line conductors of the differential transmission line 8 according to the embodiment are different from those in the first embodiment.

Figure 13:
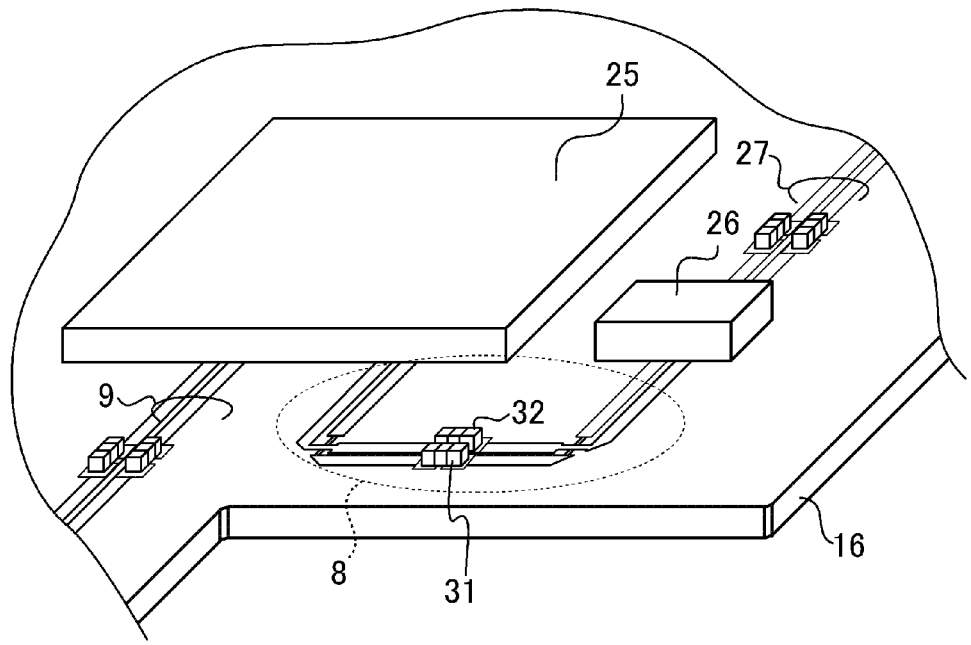
FIG. 13 is an overall perspective view of a data transmission unit of the optical transceiver module according to a fourth embodiment of the present invention.

FIG. 13 is an overall perspective view of the data transmission unit 2 of the optical transceiver module 1 according to the embodiment of the present invention. Unlike in the transmitter and receiver integration type CDR integrated circuit 3 shown in FIG. 3, the transmitter-side differential input terminal and the transmitter-side differential output terminal of the SerDes integrated circuit 25 are provided so as to be aligned at the same side. Therefore, the transmitter-side differential input transmission line 9 connected to the transmitter-side differential input terminal of the SerDes integrated circuit 25 and the differential transmission line 8 connected to the transmitter-side differential output terminal extend toward the SerDes integrated circuit 25 in parallel to each other. Accordingly, in a case where the optical transmission element module 6 (not shown) is provided on an opposite side to the side where the transmitter-side output terminal of the SerDes integrated circuit 25 is provided, the SerDes integrated circuit 25 and the optical transmission element module 6 are required to be connected to transmission lines which are reversed by 180 degrees and extend. Thus, the differential transmission line 8 according to the embodiment is a transmission line which connects the transmitter-side differential output terminal of the SerDes integrated circuit 25 to the differential input terminal of the driving integrated circuit 26 through reversal by 180 degrees and extension. As shown in FIG. 13, the differential transmission line 8 includes three straight line regions and two bent regions which are bent by 90 degrees. In addition, DC cut capacitors 31 and 32 provided in the differential transmission line 8 are the same as the DC cut capacitors 31 and 32 shown in FIG. 2.

Figure 14:
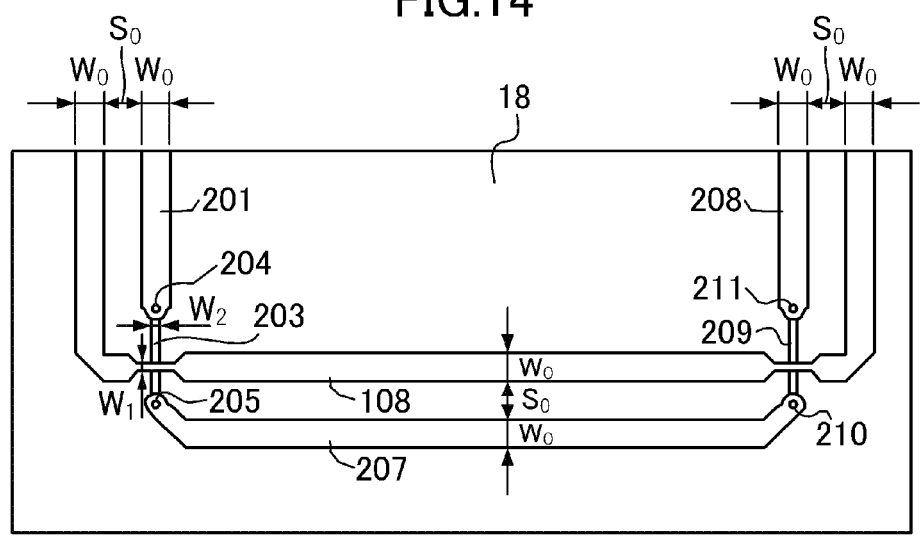
FIG. 14 is a top view illustrating vicinities of two bent regions of a differential transmission line according to the fourth embodiment of the present invention.

FIG. 14 is a top view illustrating vicinities of two bent regions of the differential transmission line 8 according to the embodiment of the present invention. In FIG. 14, the first transmission line conductor is shown by a first upper layer P data conductor film 108 formed in the first layer, and the second transmission line conductor is shown by a first upper layer N data conductor film 201, a second upper layer N data conductor film 207, a third upper layer N data conductor film 208, a first lower layer N data conductor film 203, a second lower layer N data conductor film 209, a first via hole 204, a second via hole 205, a third via hole 210, and a fourth via hole 211. In addition, as shown in FIG. 13, the two DC cut capacitors 31 and 32 are provided in the differential transmission line 8, but the DC cut capacitors 31 and 32 are not shown in FIG. 14 for simplicity of the description.

As shown in FIG. 14, according to the traveling direction of the transmission signal, the differential transmission line 8 is classified into a first straight line region, a first bent region, a second straight line region, a second bent region, and a third straight line region in this order. In a manner similar to FIG. 3, the first bent region includes a first cross region, and the second bent region includes a second cross region. In each of the first cross region and the second cross region, a pair of transmission line conductors crosses each other in a three-dimensional manner, and is perpendicular to each other when viewed from the upper side of the ground conductor layer 18.

In the same manner as the first cross region, in the second cross region, a pair of transmission line conductors cross each other in a three-dimensional manner via the dielectric layer 23 (not shown). In the second cross region, the first transmission line conductor (third transmission line conductor of the pair of transmission line conductors) linearly extends rightward (in the second direction) in the first layer, and the second transmission line conductor (fourth transmission line conductor of the pair of transmission line conductors) linearly extends upward (in the third direction) in the second layer, thereby crossing each other in a three-dimensional. In addition, in the third straight line region, both of a pair of transmission line conductors extend upward (in the third direction) in parallel to each other with the width W0 which is the third width.

A structure of the first bent region of the differential transmission line 8 shown in the left side of FIG. 14 is the same as the structure of the bent region BT shown in FIG. 3. Further, a structure of the second bent region of the differential transmission line 8 shown in the right side of FIG. 14 has line symmetry (mirror reversal) with the structure of the first bent region shown in the left side of FIG. 14 with respect to the central line (vertical line) of the figure. That is to say, the first width, the second width, and the third width are the same as each other, and the width is W0=0.39 mm such that each of the transmission lines can obtain a desired characteristic impedance. In addition, a gap between a pair of transmission line conductors in the straight line regions is the same, and has the width S0=0.515 mm.

A pair of transmission line conductors in the second bent region is as follows. The second transmission line conductor (fourth transmission line conductor of the pair of transmission line conductors) has the third via hole 210 between the second straight line region and the second cross region and the fourth via hole 211 between the second cross region and the third straight line region. The second transmission line conductor (the second upper layer N data conductor film 207) extends in the first layer from the second straight line region to the third via hole 210, the second transmission line conductor penetrates through the third via hole 210 from the first layer to the second layer, and the second transmission line conductor (the second lower layer N data conductor film 209) passes through the second cross region between the third via hole 210 and the fourth via hole 211 and extends upward in the second layer. Moreover, the second transmission line conductor penetrates through the fourth via hole 211 from the second layer to the first layer, and the second transmission line conductor (the third upper layer N data conductor film 208) extends upward from the fourth via hole 211 in the first layer.

The differential transmission line 8 according to the embodiment is bent by 90 degrees rightward from the downward (in the second direction from the first direction) in the first bent region, and is bent by 90 degrees upward from the rightward (in the third direction from the second direction) in the second bent region. In addition, the direction of the variation in the bent direction upward from the rightward (in the third direction from the second direction) is the same as the direction of the variation in the bent direction rightward from the downward (in the second direction from the first direction) is a clockwise direction, and both the directions are a clockwise direction. The first transmission line conductor (one transmission line conductor) of a pair of transmission line conductors is the outer transmission line conductor (the left side of the figure) in the first straight line region, is the inner transmission line conductor (the upper side of the figure) in the second straight line region, and is the outer transmission line conductor (the right side of the figure) in the third straight line region, with respect to the clockwise direction. In contrast, the second transmission line conductor (the other transmission line conductor) is the inner transmission line conductor (the right side of the figure) in the first straight line region, is the outer transmission line conductor (the lower side of the figure) in the second straight line region, and is the inner transmission line conductor (the left side of the figure) in the third straight line region.

The second transmission line conductor (the other transmission line conductor) is bent upward from the rightward (in the third direction from the second direction) between the second straight line region and the second cross region, and further linearly extends upward forward the front side (in the third direction). At this time, the first transmission line conductor (one transmission line conductor) passes through the second cross region from the second straight line region and linearly extends rightward (in the second direction). In addition, the first transmission line conductor (the first upper layer P data conductor film 108) crosses the second transmission line conductor (the second lower layer N data conductor film 209) in a three-dimensional manner in the second cross region. The first transmission line conductor (one transmission line conductor) is bent upward from the rightward (in the third direction from the second direction) between the second cross region and the third straight line region and further linearly extends upward (in the third direction). At this time, the second transmission line conductor (the other transmission line conductor) passes through the second cross region toward the third straight line region, and linearly extends upward (in the third direction).

As described in the first embodiment, both the width W1 of the first transmission line conductor and the width W2 of the second transmission line conductor in the first cross region are preferably smaller than the width W0 which is the first width, and both the width W1 of the first transmission line conductor and the width W2 of the second transmission line conductor in the second cross region are preferably smaller than the width W0 which is the first width. Herein, in the same manner as the first embodiment, in each of the two cross regions, both the width W1 of the first transmission line conductor and the width W2 of the second transmission line conductor in the cross region are 0.11 mm. In addition, in the same manner as the first embodiment, the diameter of each via hole is 0.1 mm. A configuration and a dimension of the printed circuit board 16 in the cross-sectional direction are the same as those in the first embodiment shown in FIG. 4.

In addition, here, although the first transmission line conductor is formed in the first layer and the second transmission line conductor is formed in the second layer in both the first cross region and the second cross region, the present invention is not limited thereto. For example, the second transmission line conductor may be formed in the first layer in both the first cross region and the second cross region.

Since the differential transmission line 8 according to the embodiment connects the SerDes integrated circuit 25 to the driving integrated circuit 26 through reversal by 180 degrees, although the differential transmission line 8 has two bent regions, conversion of the differential mode into the common mode, occurring during transmission of an electric output signal, is suppressed, and thus reflection loss can be suppressed. Therefore, effects of the present invention can be further heightened. In addition, the differential transmission line has a structure where reflection loss in the differential transmission line or noise caused by the differential transmission line is further suppressed, and the differential transmission line appropriate for higher density mounting is implemented. Therefore, effects of the present invention can be further heightened.

Figure 27:
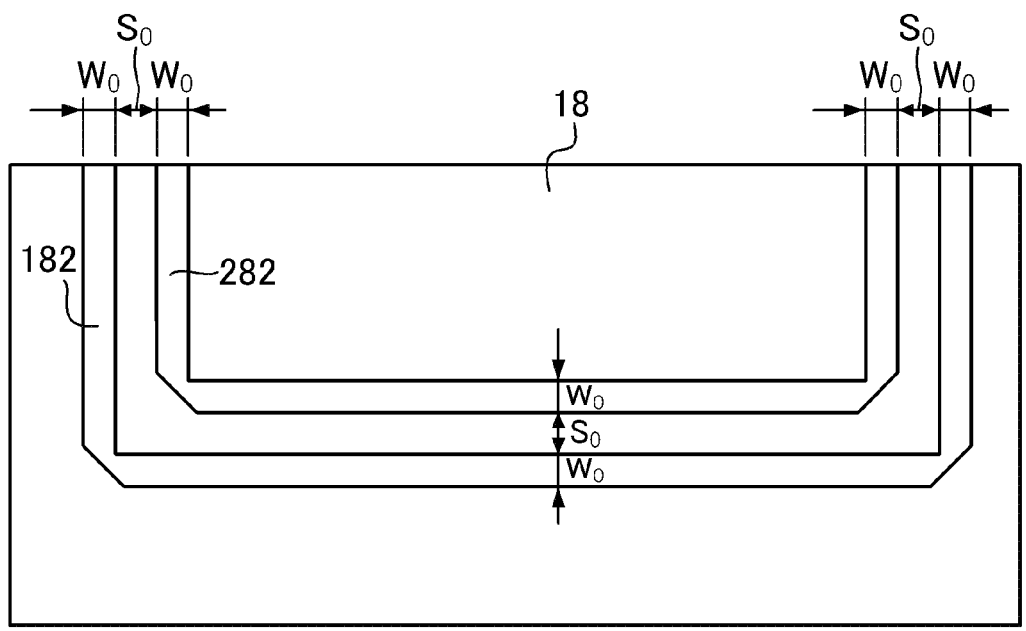
FIG. 27 is a plan view illustrating another example of the differential transmission line according to the related art.

Hereinafter, effects of the differential transmission line 8 according to the embodiment will be described. FIG. 27 is a plan view illustrating another example of the differential transmission line according to the related art. The differential transmission line having two bent regions according to the related art shown in FIG. 27 is referred to as a related example 2 as a comparative example of the embodiment.

A structure of the bent region of the differential transmission line according to the related example 2, shown in the left side of FIG. 27, is the same as the structure of the differential transmission line shown in FIG. 26, and a structure of the bent region of the differential transmission line shown in the right side of FIG. 27 has line symmetry (mirror reversal) with the structure of the bent region shown in the left side of FIG. 27 with respect to the central line (vertical line) of the figure. Here, the first transmission line conductor is a P date conductor film 182, and the second transmission line conductor is an N data conductor film 282. Dimensions and materials of the P date conductor film 182 and the N data conductor film 282 are the same as those of the differential transmission line shown in FIG. 26, and each width of the first and second transmission line conductors is the width W0, and a gap between the first and second transmission line conductors is the width S0. A pattern area required to dispose two transmission line conductors related to the related example 2 shown in FIG. 27 is substantially the same as the pattern area required to dispose two transmission line conductors related to the embodiment. However, as described above, the wire length of the P data conductor film 182 which is the first transmission line conductor is larger than the wire length of the N data conductor film 282 which is the second transmission line conductor by $4\times(S0+W0)$, and the delay time difference $\Delta$td occurs in two differential signals due to a difference between the physical lengths. If the group velocity in each of the transmission lines is denoted by vg, $\Delta$td is indicated by $\Delta td=4\times(S0+W0)/vg$, and this equation is assumed as (equation 2).

In the differential transmission line according to the related example 2, $vg=1.7\times10^8$ m/s can be obtained. By substituting S0=0.515 mm and W0=0.39 mm into the (equation 2), the delay time difference $\Delta$td of 22 ps occurs in two differential signals transmitted on the differential transmission line according to the related example 2.

Figure 15:
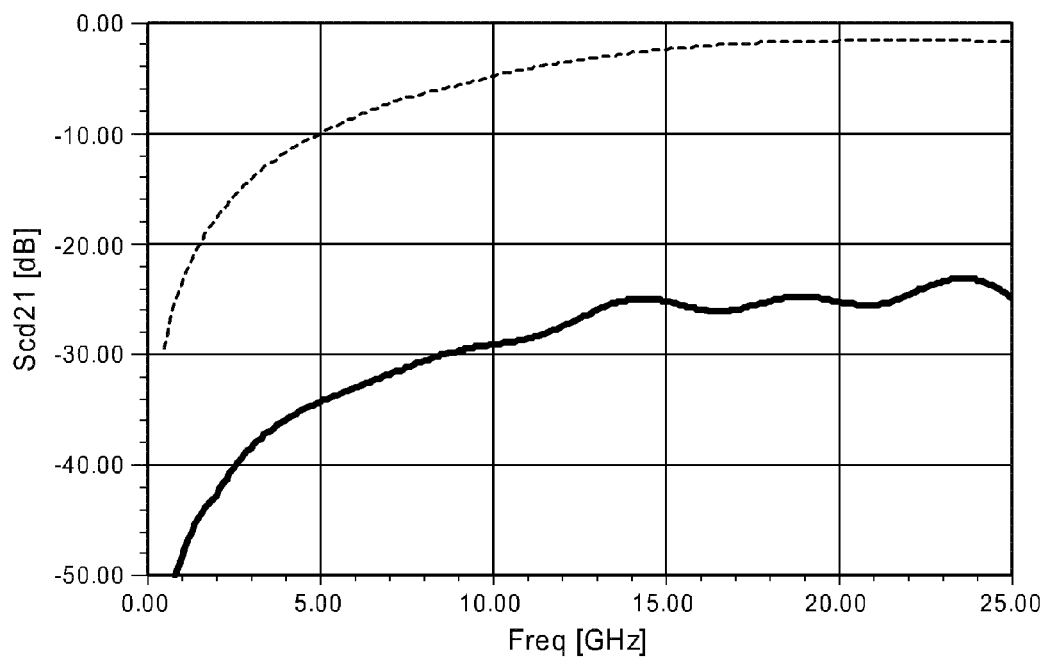
FIG. 15 is a diagram illustrating an analysis result of the differential transmission line according to the fourth embodiment of the present invention.

In contrast, effects of the differential transmission line 8 according to the embodiment will be described. FIG. 15 is a diagram illustrating an analysis result of the differential transmission line 8 according to the embodiment of the present invention. FIG. 15 shows frequency dependency of the differential mode-common mode conversion amount Scd21 of the differential transmission line 8 according to the embodiment in the same manner FIG. 5. In addition, for comparison, in the same manner as FIG. 5, FIG. 15 also shows an analysis result of the differential transmission line according to the related example 2, and the solid line indicates an analysis result according to the embodiment and the broken line indicates an analysis result according to the related example 2.

As shown in FIG. 15, although the differential transmission line 8 according to the embodiment has two bent regions, Scd21 is suppressed to −29 dB or less in a region of the frequency 10 GHz or less, and −25 dB or less in a region of the frequency 20 GHz or less. As shown in the following Table 4, occurrence of the common mode which is an unnecessary mode is reduced by about 24 dB at the frequency 10 GHz, and by about 24 dB at the frequency 20 GHz as compared with the related example 2.

TABLE 4

| FREQUENCY | RELATED EXAMPLE 2 | FOURTH EMBODIMENT |
|---|---|---|
| 10 GHz | −4.8 dB | −29.1 dB |
| 20 GHz | −1.7 dB | −25.2 dB |

In the differential transmission line 8 according to the embodiment, in the same manner as the first embodiment, the second upper layer N data conductor film 207 linearly extends toward the lower right from the second via hole 205 to the second straight line region, and linearly extends toward the upper right from the second straight line region to the third via hole 210. Since the second upper layer N data conductor film 207 has the shape shown in FIG. 14, in relation to the wire lengths measured from the respective planar shapes of a pair of transmission line conductors of the differential transmission line 8, the first transmission line conductor is longer than the second transmission line conductor. This is because the second transmission line conductor has the four via holes and thus the effective wire length of the second transmission line conductor is larger than the wire length which is measured from the planar shape. Thereby, an increase in the delay time due to the thicknesses of the four via holes is compensated for by the shape of the second upper layer N data conductor film 207 without an increase in the pattern area.

[Fifth Embodiment]

A basic configuration of the optical transceiver module 1 according to the fifth embodiment of the present invention is the same as the configuration of the optical transceiver module 1 according to the fourth embodiment, but shapes of a pair of transmission line conductors of the differential transmission line 8 according to the embodiment are different from those in the fourth embodiment.

Figure 16:
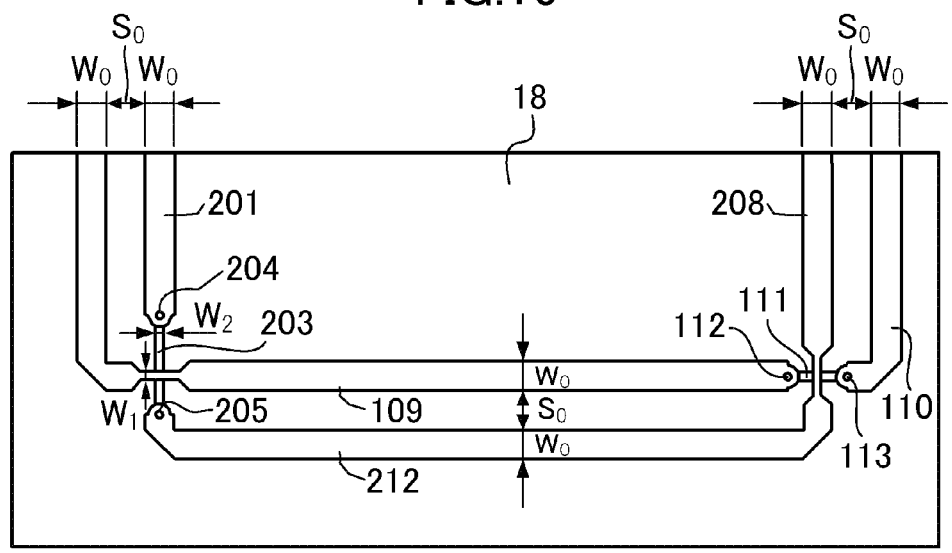
FIG. 16 is a top view illustrating vicinities of two bent regions of a differential transmission line according to a fifth embodiment of the present invention.

FIG. 16 is a top view illustrating vicinities of two bent regions of the differential transmission line 8 according to the embodiment. In FIG. 16, the first transmission line conductor is shown by a first upper layer P data conductor film 109, a second upper layer P data conductor film 110, a first lower layer P data conductor film 111, a third via hole 112, and a fourth via hole 113. In FIG. 16, the second transmission line conductor is shown by a first upper layer N data conductor film 201, a second upper layer N data conductor film 212, a first lower layer N data conductor film 203, a first via hole 204, and a second via hole 205.

As shown in FIG. 16, according to the traveling direction of the transmission signal, the differential transmission line 8 is classified into a first straight line region, a first bent region, a second straight line region, a second bent region, and a third straight line region in this order. In a manner similar to FIG. 14, the first bent region includes a first cross region, and the second bent region includes a second cross region.

The differential transmission line 8 according to the embodiment is mainly different from the differential transmission line 8 according to the fourth embodiment in a shape of the portion where the second upper layer N data conductor film 212 is bent and a structure of the second cross region.

In the differential transmission line 8 according to the embodiment, in the first cross region, in the same manner as the differential transmission line 8 according to the fourth embodiment shown in FIG. 14, the first transmission line conductor is formed in the first layer and the second transmission line conductor is formed in the second layer. However, in the second cross region, unlike in the fourth embodiment, the second transmission line conductor (third transmission line conductor of the pair of transmission line conductors) is formed in the first layer and the first transmission line conductor (fourth transmission line conductor of the pair of transmission line conductors) is formed in the second layer.

In the first bent region, the first via hole 204 and the second via hole 205 are provided in the second transmission line conductor, and, in the second bent region, the third via hole 112 and the fourth via hole 113 are provided in the first transmission line conductor. Each of a pair of transmission line conductors has two via holes. Therefore, in the same manner as the third embodiment, a delay time caused by the two via holes of the second transmission line conductor is compensated for by increasing a delay time caused by the two via holes of the first transmission line conductor. Thus, even if the film thickness of the dielectric layer 23 is varied, a delay time difference is suppressed.

Further, since the delay time difference caused by the thicknesses of the via holes is suppressed, a degree of freedom of design for shapes of a pair of transmission line conductors in the bent region is heightened. In addition, shapes of the respective bent portions of a pair of transmission line conductors are the same as each other without a particular examination on planar shape of a pair of transmission line conductors, and thereby a delay time difference occurring in a pair of transmission lines is suppressed.

In FIG. 16, in the first bent region, both the shape of the portion where the first transmission line conductor is bent on the rear side of the first cross region and the shape of the portion where the second transmission line conductor is bent on the front side of the first cross region are the same as the shape of the portion where the first upper layer P data conductor film 101 shown in FIG. 3 is bent by 90 degrees. In the same manner, in the second bent region, both the shape of the portion where the second transmission line conductor is bent on the rear side of the first cross region and the shape of the portion where the first transmission line conductor is bent on the front side of the second bent region are the same as a shape which has line symmetry (mirror reversal) with the portion where the first upper layer P data conductor film 101 shown in FIG. 3 is bent by 90 degrees with respect to the vertical line.

Here, although the first transmission line conductor is formed in the first layer in the first cross region and the second transmission line conductor is formed in the first layer in the second cross region, the present invention is not limited thereto, and the second transmission line conductor may be formed in the first layer in the first cross region and the first transmission line conductor may be formed in the first layer in the second cross region. In addition, here, if shapes which have line symmetry with each other are referred to as the same shape, although each of a pair of transmission line conductors has the bent portion of the same shape in each of the two bent regions, the present invention is not limited thereto. Even if the bent portions of the first transmission line conductor have different shapes in the two bent regions, in a case where a bent shape of the second transmission line conductor is the same as one shape of the bent portion of the first transmission line conductor in the first bent region, and a bent shape of the second transmission line conductor is the same as the other shape of the first transmission line conductor in the second bent region, a structure where a delay time difference is suppressed is implemented.

Figure 17:
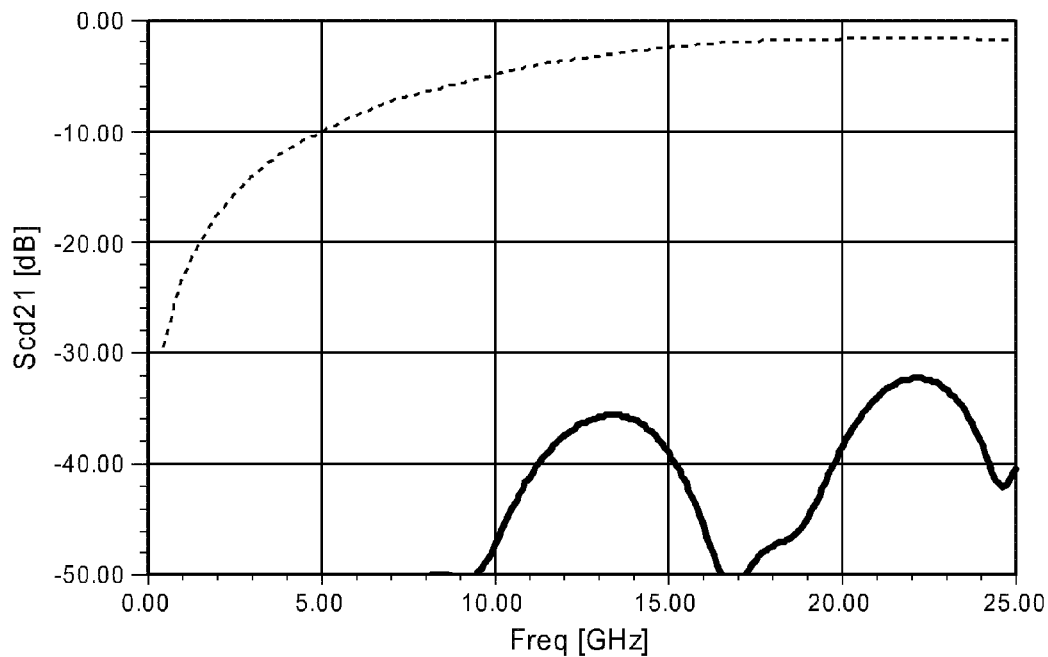
FIG. 17 is a diagram illustrating an analysis result of the differential transmission line according to the fifth embodiment of the present invention.

FIG. 17 is a diagram illustrating an analysis result of the differential transmission line 8 according to the embodiment of the present invention. FIG. 17 shows frequency dependency of the differential mode-common mode conversion amount Scd21 of the differential transmission line 8 according to the embodiment in the same manner FIG. 15. In addition, for comparison, in the same manner as FIG. 15, FIG. 17 also shows an analysis result of the differential transmission line according to the related example 2, and the solid line indicates an analysis result according to the embodiment and the broken line indicates an analysis result according to the related example 2.

As shown in FIG. 17, although the differential transmission line 8 according to the embodiment has two bent regions, Scd21 is suppressed to −47 dB or less in a region of the frequency 10 GHz or less, and −38 dB or less in a region of the frequency 20 GHz or less. As shown in the following Table 5, occurrence of the common mode which is an unnecessary mode is reduced by about 42 dB at the frequency 10 GHz, and by about 37 dB at the frequency 20 GHz as compared with the related example 2.

TABLE 5

| FREQUENCY | RELATED EXAMPLE 2 | FIFTH EMBODIMENT |
|---|---|---|
| 10 GHz | −4.8 dB | −47.2 dB |
| 20 GHz | −1.7 dB | −38.3 dB |

[Sixth Embodiment]

A basic configuration of the optical transceiver module 1 according to the sixth embodiment of the present invention is the same as the configuration of the optical transceiver module 1 according to the fourth embodiment, but shapes of a pair of transmission line conductors of the differential transmission line 8 according to the embodiment are different from those in the fourth embodiment.

Figure 18:
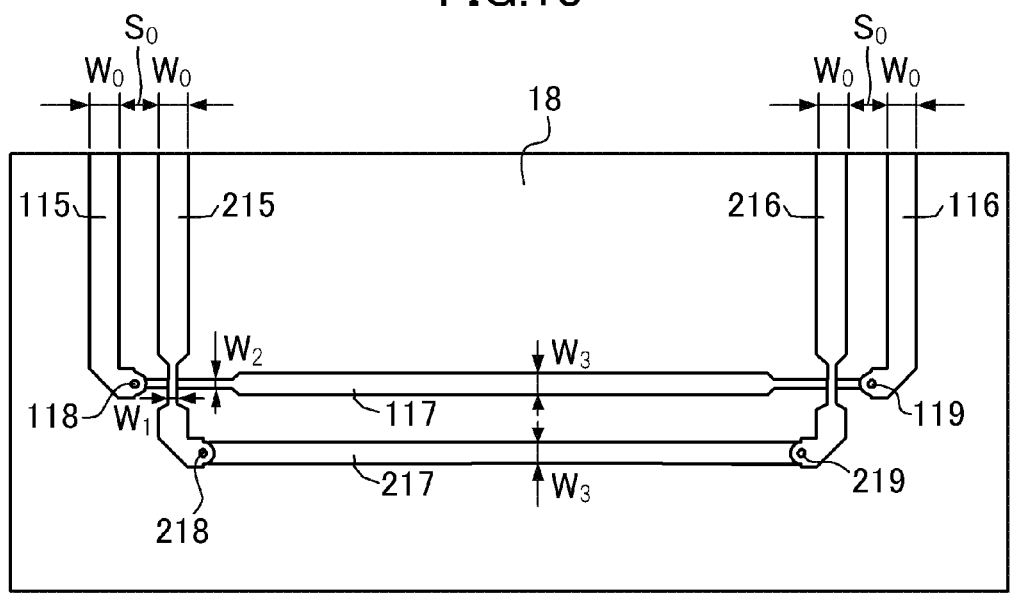
FIG. 18 is a top view illustrating vicinities of two bent regions of a differential transmission line according to a sixth embodiment of the present invention.

FIG. 18 is a top view illustrating vicinities of two bent regions of the differential transmission line 8 according to the embodiment. In FIG. 18, the first transmission line conductor is shown by a first upper layer P data conductor film 115, a second upper layer P data conductor film 116, a first lower layer P data conductor film 117, a first via hole 118, and a fourth via hole 119. The second transmission line conductor is shown by a first upper layer N data conductor film 215, a second upper layer N data conductor film 216, a first lower layer N data conductor film 217, a second via hole 218, and a third via hole 219.

As shown in FIG. 18, according to the traveling direction of the transmission signal, the differential transmission line 8 is classified into a first straight line region, a first bent region, a second straight line region, a second bent region, and a third straight line region in this order. In a manner similar to FIG. 14, the first bent region includes a first cross region, and the second bent region includes a second cross region. In each of the first cross region and the second cross region, a pair of transmission line conductors cross each other in a three-dimensional manner, and are perpendicular to each other when viewed from the upper side of the ground conductor layer 18.

Although, in the differential transmission line 8 according to any embodiment described hitherto, a pair of transmission line conductors are formed together on the same layer which is the first layer in the first straight line region and the second straight line region which are respectively disposed on the rear side and the front side of the first cross region, the present invention is not limited thereto. In the differential transmission line 8 according to the embodiment, a pair of transmission line conductors are formed together in the second layer which is different from the first layer in the second straight line region.

First, a structure of the differential transmission line 8 according to the embodiment, shown in the left side of FIG. 18, will be described. In the first transmission line conductor (second transmission line conductor of the pair of transmission line conductors), the first via hole 118 is disposed between the first straight line region and the first cross region, and, in the second transmission line conductor (first transmission line conductor of the pair of transmission line conductors), the second via hole 218 is disposed on the front side of the cross region and between the first cross region and the second straight line region.

The first transmission line conductor (the first upper layer P data conductor film 115) extends in the first layer from the first straight line region to the first via hole 118, the first transmission line conductor penetrates through the first via hole 118 from the first layer to the second layer, and the first transmission line conductor (the first lower layer P data conductor film 117) passes through the first cross region and extends toward the second straight line region in the second layer. In contrast, the second transmission line conductor (the first upper layer N data conductor film 215) passes through the first cross region from the first straight line region and extends toward the second via hole 218 in the first layer, the second transmission line conductor penetrates through the second via hole 218 from the first layer to the second layer, and the second transmission line conductor (the first lower layer N data conductor film 217) extends in the second layer from the second via hole 218 to the second straight line region.

In the first straight line region, the first transmission line conductor (one transmission line conductor) is the outer transmission line conductor, and the second transmission line conductor (the other transmission line conductor) is the inner transmission line conductors with respect to the direction of the variation in the bent direction rightward from the downward (in the second direction from the first direction). Between the first straight line region and the first cross region, the first transmission line conductor is bent rightward from the downward (in the second direction from the first direction), further passes through the first cross region toward the front side, and linearly extends rightward (in the second direction) up to the second straight line region. In contrast, the second transmission line conductor passes through the first cross region from the first straight line region and linearly extends downward (in the first direction) toward the front side, is bent rightward from the downward (in the second direction from the first direction) between the first cross region and the second straight line region, and further linearly extends rightward (in the second direction) toward the front side up to the second straight line region.

In the differential transmission line 8 according to the embodiment, each of a pair of transmission line conductors has a via hole in the first bent region, and a structure where a delay time difference caused by the thicknesses of the via holes is suppressed is implemented in the same manner as the differential transmission line 8 according to the fifth embodiment. Therefore, a degree of freedom of design for shapes of a pair of transmission line conductors in the bent region is heightened. In addition, shapes of the respective bent portions of a pair of transmission line conductors are the same as each other without a particular examination on planar shape of a pair of transmission line conductors, and thereby a delay time difference occurring in a pair of transmission lines is suppressed. In FIG. 18, in the first bent region, both the shape of the portion where the first transmission line conductor is bent on the rear side of the first cross region and the shape of the portion where the second transmission line conductor is bent on the front side of the first cross region are the same as the shape of the portion where the first upper layer P data conductor film 101 shown in FIG. 3 is bent by 90 degrees.

Further, both of a pair of transmission line conductors are formed in the first layer in the first straight line region, whereas it is formed together in the second layer which is a lower layer than the first layer in the second straight line region. Therefore, the second width which is a width of each of a pair of transmission line conductors in the second straight line region is preferably a width suitable for a pair of transmission line conductors to obtain the same impedance characteristic as a desired impedance in the first straight line region, in the second straight line region as well. The distance between the second layer and the ground conductor layer 18 is shorter than the distance between the first layer and the ground conductor layer 18, and, the second width which is the optimum from the viewpoint of reducing differential reflection loss is preferably smaller than the first width W0 (0.39 mm) and is the width W3 (0.29 mm).

Next, a structure of the differential transmission line 8 according to the embodiment, shown in the right side of FIG. 18, will be described. In the second transmission line conductor (third transmission line conductor of the pair of transmission line conductors), the third via hole 219 is disposed between the second straight line region and the second cross region, and, in the first transmission line conductor (fourth transmission line conductor of the pair of transmission line conductors), the fourth via hole 119 is disposed on the front side of the second cross region and between the second cross region and the third straight line region.

The second transmission line conductor (the first lower layer N data conductor film 217) extends in the second layer from the second straight line region to the third via hole 219, the second transmission line conductor penetrates through the third via hole 219 from the second layer to the first layer, and the second transmission line conductor (the second upper layer N data conductor film 216) passes through the second cross region and extends toward the third straight line region in the first layer. In contrast, the first transmission line conductor (the first lower layer P data conductor film 117) passes through the second cross region from the second straight line region and extends toward the fourth via hole 119 in the second layer, the first transmission line conductor penetrates through the fourth via hole 119 from the second layer to the first layer, and the first transmission line conductor (second upper layer P data conductor film 116) extends in the first layer from the fourth via hole 119 to the third straight line region.

The second transmission line conductor (the other transmission line conductor) is bent upward from the rightward (in the third direction from the second direction) between the second straight line region and the second cross region, further passes through the second cross region toward the front side, and linearly extends upward (in the third direction) up to the third straight line region. In contrast, the first transmission line conductor (one transmission line conductor) passes through the second cross region from the second straight line region and linearly extends rightward (in the second direction) toward the front side, is bent upward from the rightward (in the third direction from the second direction) between the second cross region and the third straight line region, and further linearly extends upward (in the third direction) toward the front side up to the third straight line region.

In the differential transmission line 8 according to the embodiment, each of a pair of transmission line conductors has a via hole in the second cross region, and thus a structure where a delay time difference due to the thicknesses of the via holes is suppressed is implemented in the same manner as the first cross region. Therefore, a degree of freedom of design for shapes of a pair of transmission line conductors in the bent region is heightened. In addition, shapes of the respective bent portions of a pair of transmission line conductors are the same as each other without a particular examination on planar shape of a pair of transmission line conductors, and thereby a delay time difference occurring in a pair of transmission lines is suppressed. In FIG. 18, in the second bent region, both the shape of the portion where the second transmission line conductor is bent on the rear side of the second cross region and the shape of the portion where the first transmission line conductor is bent on the front side of the second cross region are the same as the shape having line symmetry with the portion where the first upper layer P data conductor film 101 shown in FIG. 3 is bent by 90 degrees, with respect to the vertical line. In addition, in the same manner as the differential transmission line 8 according to the fifth embodiment, even if the bent portions of the first transmission line conductor have different shapes in the two bent regions, in a case where a bent shape of the second transmission line conductor is the same as one shape of the bent portion of the first transmission line conductor in the first bent region, and a bent shape of the second transmission line conductor is the same as the other shape of the first transmission line conductor in the second bent region, a structure where a delay time difference is suppressed is implemented.

In addition, here, although the second transmission line conductor is a transmission line conductor (first or third transmission line conductors of the pair of transmission line conductors) formed in the first layer and the first transmission line conductor is a transmission line conductor (second or fourth transmission line conductor of the pair of transmission line conductors) formed in the second layer in both the first cross region and the second cross region, the present invention is not limited thereto. The first transmission line conductor may be formed in the first layer in both the first cross region and the second cross region. In addition, the first transmission line conductor may be formed in the first layer in one cross region, and the second transmission line conductor may be formed in the first layer in the other cross region.

Figure 19:
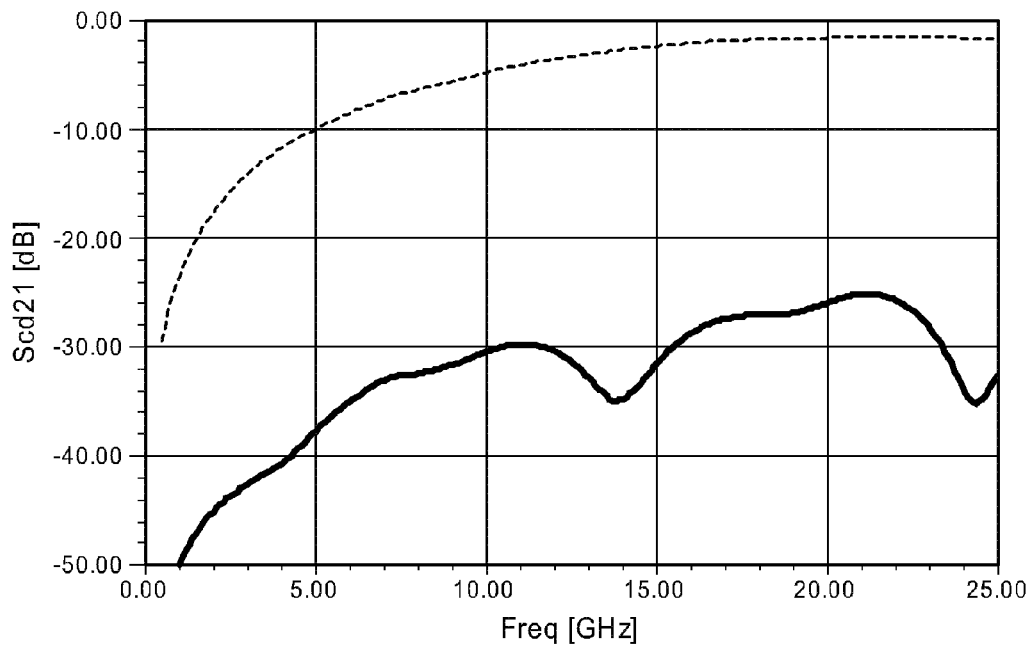
FIG. 19 is a diagram illustrating an analysis result of the differential transmission line according to the sixth embodiment of the present invention.

FIG. 19 is a diagram illustrating an analysis result of the differential transmission line 8 according to the embodiment of the present invention. FIG. 19 shows frequency dependency of the differential mode-common mode conversion amount Scd21 of the differential transmission line 8 according to the embodiment in the same manner FIG. 15. In addition, for comparison, in the same manner as FIG. 15, FIG. 19 also shows an analysis result of the differential transmission line according to the related example 2, and the solid line indicates an analysis result according to the embodiment and the broken line indicates an analysis result according to the related example 2.

As shown in FIG. 19, although the differential transmission line 8 according to the embodiment has two bent regions, Scd21 is suppressed to −30 dB or less in a region of the frequency 10 GHz or less, and −25 dB or less in a region of the frequency 20 GHz or less. As shown in the following Table 6, occurrence of the common mode which is an unnecessary mode is reduced by about 26 dB at the frequency 10 GHz, and by about 24 dB at the frequency 20 GHz as compared with the related example 2.

TABLE 6

| FREQUENCY | RELATED EXAMPLE 2 | SIXTH EMBODIMENT |
|---|---|---|
| 10 GHz | −4.8 dB | −30.4 dB |
| 20 GHz | −1.7 dB | −25.9 dB |

As above, the optical transceiver module having the differential transmission line according to the embodiments of the present invention has been described. In addition, although the differential transmission line 8 provided between the transmitter and receiver integration type CDR integrated circuit 3 and the driving integrated circuit 4 in the first to third embodiments, and the differential transmission line 8 provided between the SerDes integrated circuit 25 and the driving integrated circuit 26 in the fourth to sixth embodiments, have been described, the present invention is not limited thereto. In a case where a bent region is required to be provided in any differential transmission line shown in FIG. 3 or 13, the present invention is applicable thereto. Further, the present invention is not limited to the differential transmission line provided in the optical transceiver module, and the present invention is applicable in a case where a bent region is required to be provided in the differential transmission line included in other optical modules and other devices.

[Seventh Embodiment]

Figure 20:
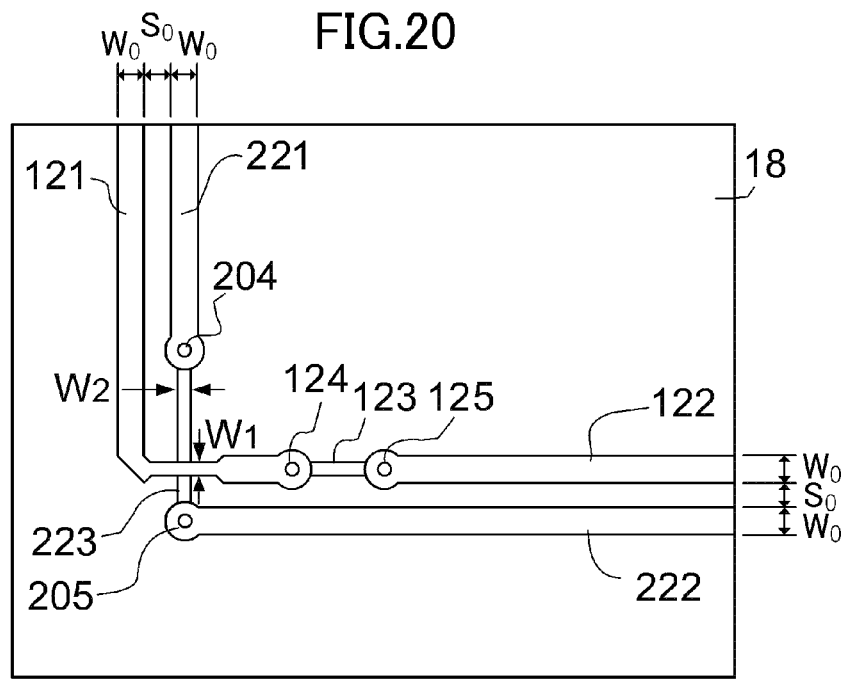
FIG. 20 is a top view illustrating a vicinity of a bent region of a differential transmission line according to a seventh embodiment of the present invention.
Figure 21:
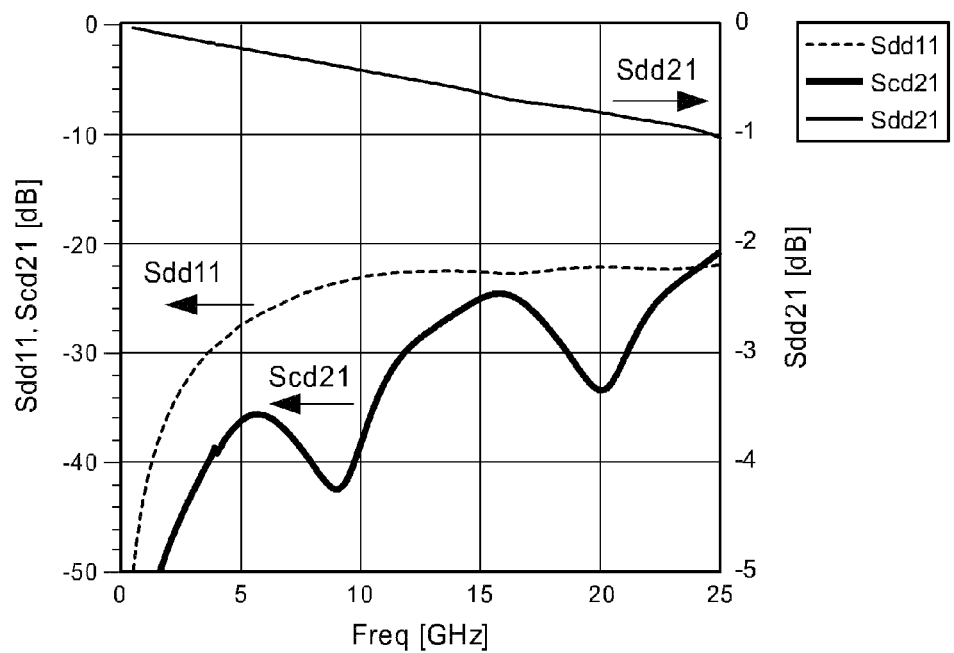
FIG. 21 is a diagram illustrating an analysis result of the differential transmission line according to the seventh embodiment of the present invention.
Figure 22:
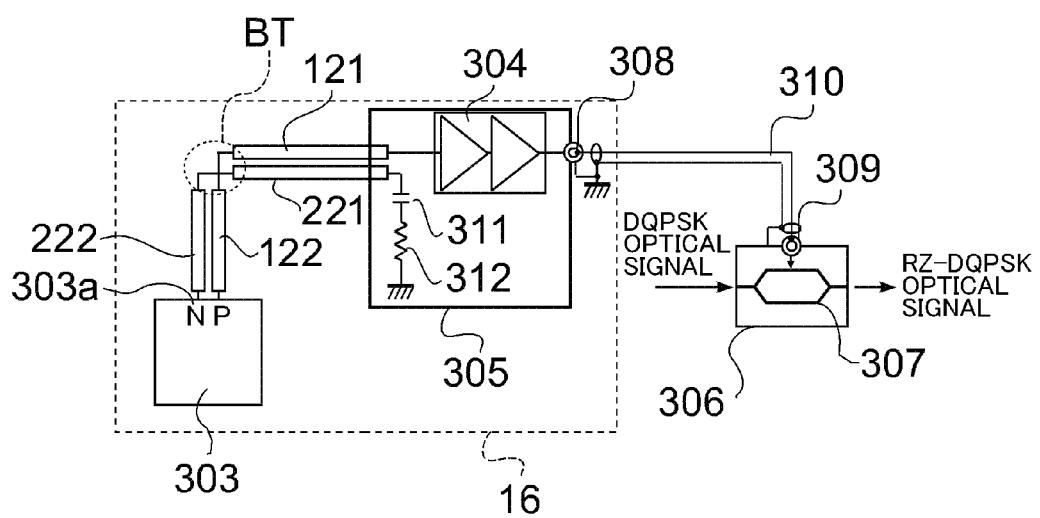
FIG. 22 is a circuit diagram of an RZ modulation unit of an information processing system according to the seventh embodiment of the present invention.
Figure 23:
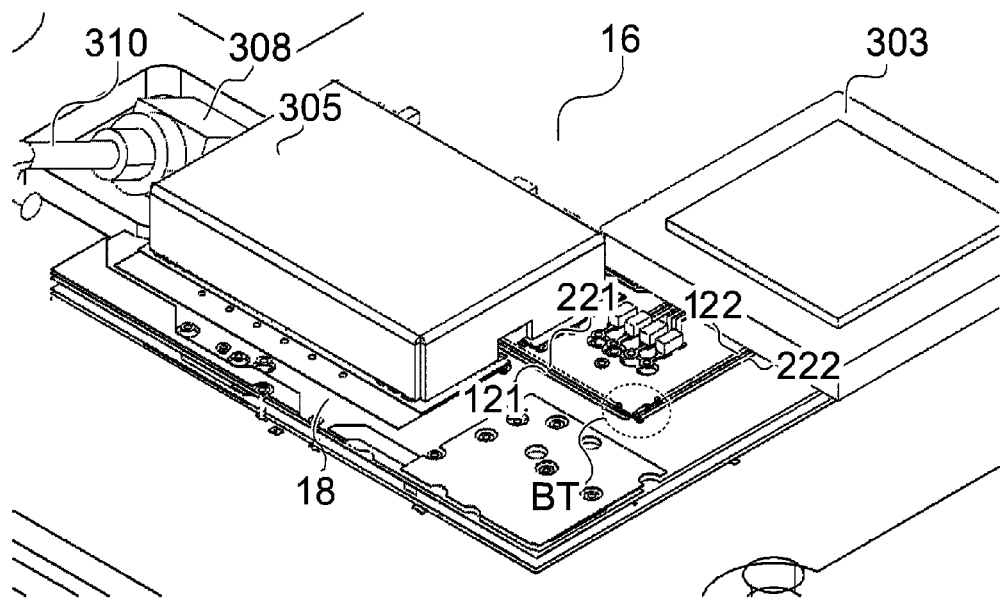
FIG. 23 is a perspective view of the RZ modulation unit of the information processing system according to the seventh embodiment of the present invention.

An information processing system (information processing apparatus) according to the seventh embodiment of the present invention will be described with reference to FIGS. 20 to 23. FIG. 20 is a top view illustrating the vicinity of the bent region of the differential transmission line according to the embodiment of the present invention. FIG. 21 is a diagram illustrating an analysis result of the differential transmission line according to the embodiment. FIG. 22 is a circuit diagram of an RZ modulator of the information processing system according to the embodiment. FIG. 23 is a perspective view of the RZ modulator of the information processing system according to the embodiment.

The information processing system according to the embodiment is an optical transceiver of an RZ-DQPSK (Return to Zero Differential Quadrature Phase Shift Keying) type which works at bit rate 44.6 Gbit/s, and uses the differential transmission line shown in FIG. 20 as wires for high-speed clock signals of the frequency 22.3 GHz.

First, a configuration of the differential transmission line according to the embodiment will be described with reference to FIG. 20. The differential transmission line shown in FIG. 20 is different from the differential transmission line 8 shown in FIG. 3 in shapes of a pair of transmission line conductors. In FIG. 20, the first transmission line conductor (first transmission line) is shown by a first upper layer P data conductor film 121, a second upper layer P data conductor film 122, a first lower layer P data conductor film 123, a third via hole 124, and a fourth via hole 125. The second transmission line conductor (second transmission line) is shown by a first upper layer N data conductor film 221, a second upper layer N data conductor film 222, a first lower layer N data conductor film 223, a first via hole 204, and a second via hole 205. In the same manner as FIG. 3, the differential transmission line is classified into a first straight line region, a bent region (90-degree bent portion), and a second straight line region, in this order, according to the traveling direction of the transmission signal, and the bent region includes a cross region.

In the first straight line region, both the first upper layer P data conductor film 121 and the first upper layer N data conductor film 221 extend downward (in the first direction) in parallel to each other with the width W0 which is the first width, and the first upper layer P data conductor film 121 and the first upper layer N data conductor film 221 are respectively referred to as a first conductive film and a fourth conductive film. In the cross region, the first upper layer P data conductor film 121 and the first lower layer N data conductor film 223 cross each other in a three-dimensional manner, and both of the width W1 of the first upper layer P data conductor film 121 and the width W2 of the first lower layer N data conductor film 223 in the cross region are smaller than the width W0 which is the first width. The first upper layer P data conductor film 121 and the first lower layer N data conductor film 223 are respectively referred to as a second conductive film and a fifth conductive film. In the second straight line region, both the second upper layer P data conductor film 122 and the second upper layer N data conductor film 222 extend rightward (in the second direction) in parallel to each other with the width W0 which is a second width. In addition, here, the first width is the same as the second width. The second upper layer P data conductor film 122 and the second upper layer N data conductor film 222 are respectively referred to as a third conductive film and a sixth conductive film. Therefore, in the first transmission line conductor (first transmission line), the first conductive film, the second conductive film, and the third conductive film are sequentially arranged according to the transmission direction, and are electrically connected to each other. In the same manner, in the second transmission line conductor (second transmission line), the fourth conductive film, the fifth conductive film, and the sixth conductive film are sequentially arranged according to the transmission direction, and are electrically connected to each other.

In addition, in the differential transmission line, the traveling direction of the transmission signal may be a forward or backward direction and a case where the traveling direction of the transmission signal is a direction reverse to the above-described direction will be described below. In this case, the portions located in the straight line region of the second upper layer P data conductor film 122 and the second upper layer N data conductor film 222 may be respectively a first conductive film and a fourth conductive film, and the portions located in the straight line region of the first upper layer P data conductor film 121 and the first upper layer N data conductor film 221 may be respectively a third conductive film and a sixth conductive film. In this case, the first conductive film and the fourth conductive film extends leftward (in the first direction) in parallel to each other, and the third conductive film and the sixth conductive film extend upward (in the second direction) in parallel to each other.

The differential transmission line shown in FIG. 20 is different from the differential transmission line 8 shown in FIG. 3 in the dimensions. Each width W0 of a pair of transmission line conductors in the first and second straight line regions is 0.2 mm, and the width S0 which is a gap between the first transmission line conductor and the second transmission line conductor is 0.2 mm. In addition, the width W1 of the first transmission line conductor (the first upper layer P data conductor film 121) in the cross region is 0.1 mm which is smaller than the width W0. In the same manner, the width W2 of the second transmission line conductor (the first lower layer N data conductor film 223) in the cross region is 0.1 mm which is smaller than the width W0. In addition, the wire width of the first lower layer P data conductor film 123 is 0.1 mm. These values are appropriate for reduction in differential reflection loss.

Next, an analysis result of the differential transmission line in FIG. 20 will be described with reference to FIG. 21. The following shows characteristics in a case where a line length of the differential transmission line is 14 mm as an example, and shows a result analyzed using a 3D electromagnetic field structure solver. The curves shown in FIG. 21 sequentially indicate a frequency dependency of a differential transmission characteristic (Sdd21), a differential reflection coefficient (Sdd11), and a differential mode-common mode conversion amount (Scd21) from the above. As shown in FIG. 21, although the differential transmission line according to the embodiment includes the bent region, Scd21 is suppressed to −21 dB or less in a region of the frequency 25 GHz or less. In addition, Sdd11 is −22 dB or less, and Sdd21 is −1.1 dB or more, which are favorable values.

The following Table 7 shows that the differential transmission line according to the embodiment is compared with the related examples with regard to a value of the differential mode-common mode conversion amount Scd21 at the frequency 22.3 GHz and a value of the maximum electric field intensity (Max E field at 3 m) of unintentional electromagnetic radiation at the distance 3 m which is calculated from the distant electromagnetic field when differential signals of the frequency 22.3 GHz and the amplitude 2 V are input to differential transmission lines. As compared with the related example 1 (FIG. 26), occurrence of the common mode which is an unnecessary mode is reduced by about 23 dB, and the maximum electric field intensity of the unintentional electromagnetic radiation is reduced by about 13 dB.

Figure 28:
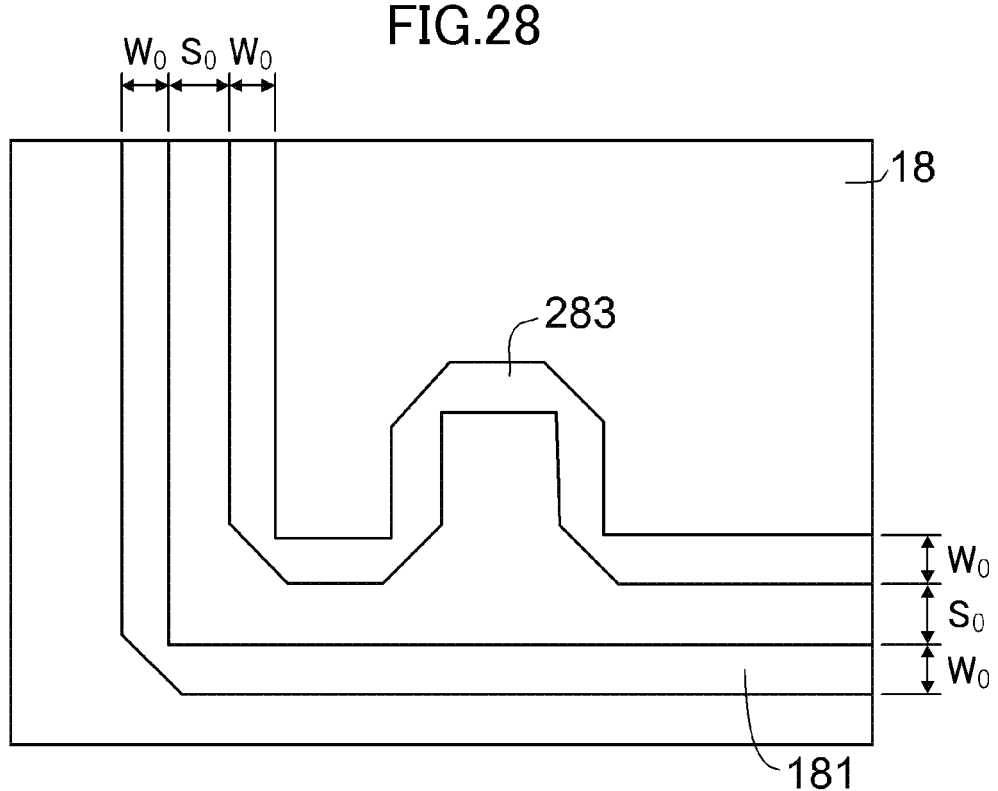
FIG. 28 is a plan view illustrating still another example of the differential transmission line according to the related art.
Figure 29:
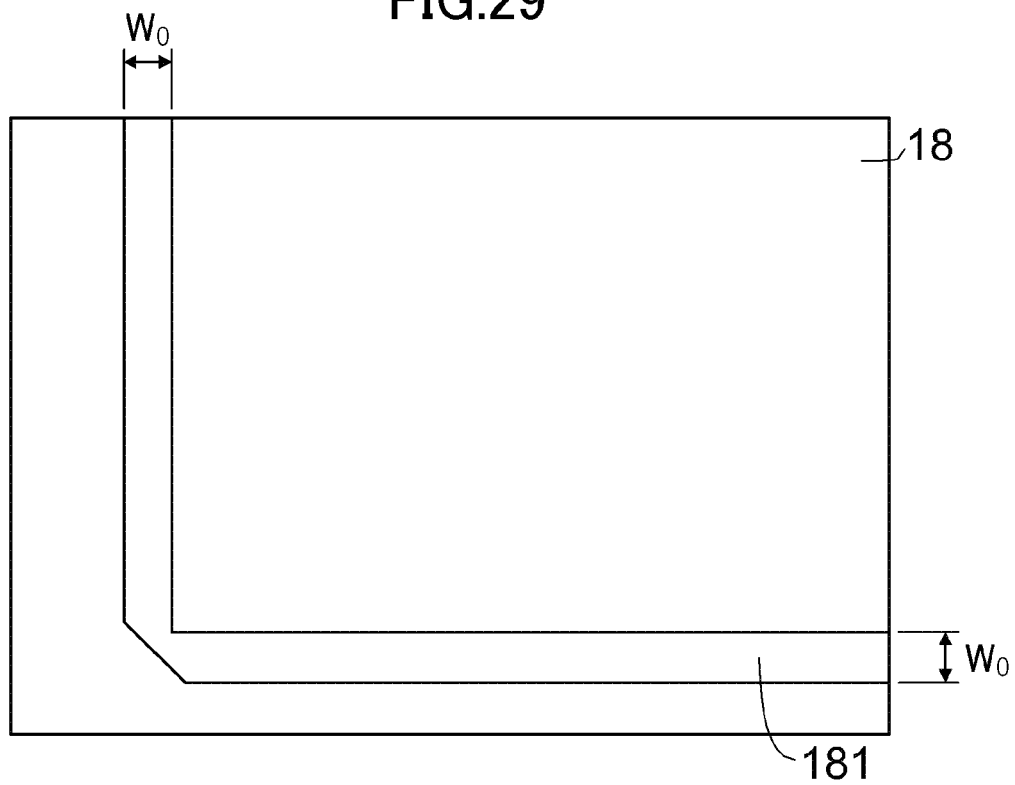
FIG. 29 is a plan view illustrating an example of the transmission line according to the related art.

FIG. 28 is a plan view illustrating another example of the differential transmission line according to the related art. The differential transmission line according to the related art shown in FIG. 28 is referred to as a related example 3 as a comparative example of the embodiment. In the differential transmission line related to the related example 3, a method is used in which a meandered portion is provided in the N data conductor film 283 shown in FIG. 28 so as to compensate for a delay time difference occurring due to the 90° bent portion (bent region), and thereby a pair of differential transmission lines have equal length wires. In the differential transmission line related to the related example 3, Scd21 is −30 dB or less, which is favorable, but the maximum electric field intensity of unintentional electromagnetic radiation is 99 dB(μV/m) which is nearly the same as that of the related example 1. The differential transmission line according to the embodiment achieves an effect that the maximum electric field intensity of unintentional electromagnetic radiation is reduced by about 14 dB as compared with the related example 3. In addition, FIG. 29 is a plan view illustrating an example of the transmission line according to the related art. The transmission line according to the related art shown in FIG. 29 is referred to as a related example 4 as a comparative example of the embodiment. The transmission line related to the related example 4 is a single end transmission line having a 90° bent portion (bent region), and an input signal amplitude is 1 V. In the differential transmission line related to the related example 4, the maximum electric field intensity of unintentional electromagnetic radiation is 99 dB(μV/m) which is nearly the same as that of the related example 1. The differential transmission line according to the embodiment achieves an effect that the maximum electric field intensity of unintentional electromagnetic radiation is reduced by about 14 dB as compared with the related example 4. Here, the transmission line related to the related example 4 has a structure configured only by the P data conductor film 181 by omitting the N data conductor film 281 from the differential transmission line related to the related example 1.

TABLE 7

| CHARACTERISTICS | RELATED EXAMPLE 1 | RELATED EXAMPLE 3 | RELATED EXAMPLE 4 | SEVENTH EMBODIMENT |
|---|---|---|---|---|
| MaxEfield | 98 dB (μV/m) | 99 dB (μV/m) | 99 dB (μV/m) | 85 dB (μV/m) |
| Scd21 | −4.1 dB | −30.1 dB | — | −27.7 dB |

Next, a circuit configuration of the RZ modulator will be described with reference to FIG. 22. On the same surface of the printed circuit board 16, a multiplexer integrated circuit 303, a high-frequency power amplifier integrated circuit 304, a shield cover 305, a DC cut capacitor 311, and a termination resistor 312 are disposed. The multiplexer integrated circuit 303 generates clocks, and has a clock differential output terminal 303*a*. A signal output from the clock differential output terminal 303*a* is a clock signal with an operation frequency of 22.3 GHz. One end pair of the differential transmission lines having the 90° bent portion (bent region BT) shown in FIG. 20 is connected to the clock differential output terminal 303*a* of the multiplexer integrated circuit 303, and one of the other end pair of the differential transmission lines is connected to the input terminal of the high-frequency power amplifier integrated circuit 304. The other of the other end pair of the differential transmission lines is connected to the termination resistor 312 via the DC cut capacitor 311, and terminates to prevent from generating high-frequency reflection. As the DC cut capacitor 311, a surface-mounted capacitor having a capacitance value of, for example, 0.1 μF is used. As the termination resistor 312, a surface-mounted resistor is used.

A resistance value thereof is appropriately 50Ω, and may be 51Ω which is an E series resistance value. A clock signal output from the clock differential output terminal 303a is amplified by the high-frequency power amplifier integrated circuit 304, and is input to an LN intensity modulator 307 disposed inside an pulse carver optical modulator 306 from the output terminal of the high-frequency power amplifier integrated circuit 304 via a coaxial connector 308, a coaxial cable 310, and a coaxial connector 309. Thereby, the pulse carver optical modulator 306 modulates a DQPSK optical signal into an RZ-DQPSK optical signal.

The package of the pulse carver optical modulator 306 is made of metal, and is made of stainless steel. The metal package covers the LN intensity modulator 307 and is connected to a ground potential. The coaxial connectors 308 and 309 and the coaxial cable 310 are covered by an external conductor, and the external conductor is connected to the ground potential. The clock signal output from the output terminal of the high-frequency power amplifier integrated circuit 304 has very large signal intensity at the frequency 22.3 GHz, but a good shield effect is achieved with the configuration, and thus unintentional electromagnetic radiation to the outside can be sufficiently suppressed.

The shield cover 305 is made of metal, and is formed through processing of, for example, sheet metal. The shield cover 305 is disposed so as to cover the upper part of the region including the high-frequency power amplifier integrated circuit 304, the DC cut capacitor 311, and the termination resistor 312. The ground conductor layer 18 is disposed in the lower region of the shield cover 305, and the ground conductor layer 18 is electrically connected to the shield cover 305 via plural via holes. The clock signal output from the clock differential output terminal 303a enters the shield cover 305, and then is distributed into the high-frequency power amplifier integrated circuit 304, the DC cut capacitor 311, and the termination resistor 312, but a sufficient shield effect is achieved by the shield cover 305 and the ground conductor layer 18 with the configuration, and thus unintentional electromagnetic radiation to the outside from this region can be sufficiently suppressed.

In addition, the differential transmission line having the 90° bent portion (bent region BT) shown in FIG. 20 is disposed in the region from the clock differential output terminal 303a to the shield cover 305, and thereby it is possible to reduce unintentional electromagnetic radiation to the space from the differential transmission line as shown in Table 7.

FIG. 23 is a perspective view of the RZ modulator of the information processing system according to the embodiment. The RZ-DQPSK optical transceiver has optical components having a relatively large volume mounted therein, such as the pulse carver optical modulator 306, a DQPSK optical modulation module (not shown), and a DQPSK optical demodulation module (not shown), and thus disposition of the electronic components is restricted to a small area. In addition, since the multiplexer integrated circuit 303 includes plural differential input terminals, or differential output terminals of high-speed digital signals of I channel or Q channel, there are many cases where a degree of freedom for the disposition itself of the multiplexer integrated circuit 303 is low, and it is difficult for the differential output terminals to be linearly disposed. In the embodiment, by the use of the differential transmission line having the 90° bent portion (bent region BT), disposition of the electronic components of the RZ modulator can realize compact disposition as shown in FIG. 23 and is thus appropriate for high density mounting.

Although the clock frequency of the clock signal output from the clock differential output terminal 303a is 22.3 GHz in the embodiment, the frequency may be changed according to a bit rate at which the optical transceiver is operated, and, for example, an operation bit rate may be 43.0 Gbit/s and the frequency may be 21.5 GHz. In addition, the high-frequency power amplifier integrated circuit 304 may be a driver integrated circuit. Further, although the shield cover 305 is formed through the sheet metal processing in the embodiment, the shield cover 305 may be configured using a structure which is integrally formed with the metal case of the optical transceiver.

In the information processing system having the differential transmission line mounted therein, unintentional electromagnetic radiation from the differential transmission line is problematic. In the high-speed digital signal transmission device, it is necessary to design a case of the system so as to satisfy allowable intensity of unintentional electromagnetic radiation. Particularly, if a frequency of the unintentional electromagnetic radiation exceeds 10 GHz, case structure components are made of metal with very small gaps therebetween and cover the printed circuit board, or an electric wave absorption material is disposed inside the case, and thereby an intensity of the unintentional electromagnetic radiation leaked to outside from the system is required to be suppressed to a value limit or the like defined in the law, according to the strength of unintentional electromagnetic radiation from the printed circuit board. For example, in the U.S., it is necessary to satisfy the value limit 53.9 dB(μV/m) (Class B standards, in the case of the distance 3 m, and the frequency range 1 GHz to 40 GHz) defined in the FCC Part 15 Subpart B standards. When unintentional electromagnetic radiation from the printed circuit board is increased, processing means having high dimension accuracy is used to manufacture the case structure components, and thus a cost increase of the case structure components is problematic. Alternatively, a volume of the electric wave absorption material of relatively high price is increased, and thus a cost increase is problematic.

For example, in the method of achieving equal length wires through examination of shapes of a pair of transmission lines as in the differential transmission line according to the related art shown in FIG. 28, a shape which is partially meandered is provided, and thus the meandered portion causes enlargement of unnecessary electromagnetic fields, thereby increasing unintentional electromagnetic radiation. In contrast, in the technique disclosed in Japanese Patent No. 3954641, plural slots provided on the ground conductor layer cause enlargement of unnecessary electromagnetic fields, thereby increasing unintentional electromagnetic radiation. However, in the information processing system according to the embodiment, without using a shape which is partially meandered in the differential transmission line, or without providing plural slots on the ground conductor layer, a delay time difference of differential signals transmitted on a pair of differential transmission lines is suppressed, and further unintentional electromagnetic radiation is suppressed. Thereby, in the differential transmission line formed on the printed circuit board of the information processing system, it is possible to implement the information processing system where a cost increase is suppressed, and unintentional electromagnetic radiation is suppressed in a bent region even if the differential transmission line includes the bent region.

As above, the information processing system according to the embodiment has been described. Although the above description is related to the technique assuming the optical transceiver, for example, the optical transceiver module and the like based on the 300 pin MSA standards, as an information processing system, the optical transceiver is not formed as a module but may be an optical transmission system having a transmission circuit and a reception circuit mounted in the system. In this case, the case covering the optical transmission system is not required to have a robust shield function for electromagnetic leakage, and thus system costs can be reduced.

[Eighth Embodiment]

Figure 24:
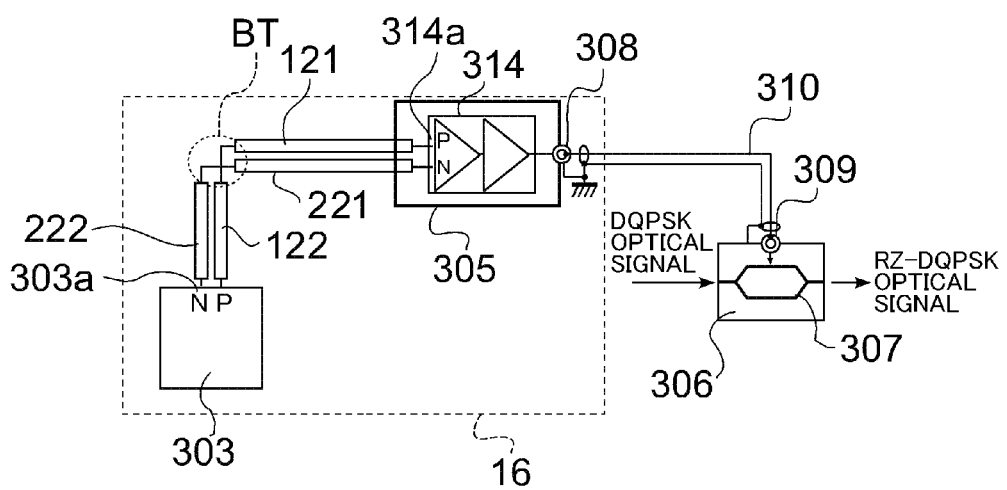
FIG. 24 is a circuit diagram of an RZ modulation unit of an information processing system according to an eighth embodiment of the present invention.

An information processing system according to the eighth embodiment will be described with reference to FIG. 24. FIG. 24 shows a circuit diagram of the RZ modulator of the information processing system according to the embodiment of the present invention, and the RZ modulator according to the embodiment is different from the RZ modulator according to the seventh embodiment in that a high-frequency power amplifier integrated circuit 314 having a differential input terminal 314a is disposed instead of the high-frequency power amplifier integrated circuit 304 having the single input terminal.

One end pair of the differential transmission lines having the 90° bent portion (bent region BT) shown in FIG. 20 is connected to the clock differential output terminal 303a of the multiplexer integrated circuit 303, and the other end pair of the differential transmission lines is connected to the differential input terminal 314a of the high-frequency power amplifier integrated circuit 314.

According to the embodiment, in a case where power gains of the high-frequency power amplifier integrated circuits which are used are the same as each other, power at the frequency 22.3 GHz of a clock signal output from the clock differential output terminal 303a can be reduced to ½, and thus there can be an achievement of an effect that unintentional electromagnetic radiation to the space from the differential transmission line is reduced by 3 dB as compared with the seventh embodiment.

[Ninth Embodiment]

Figure 25:
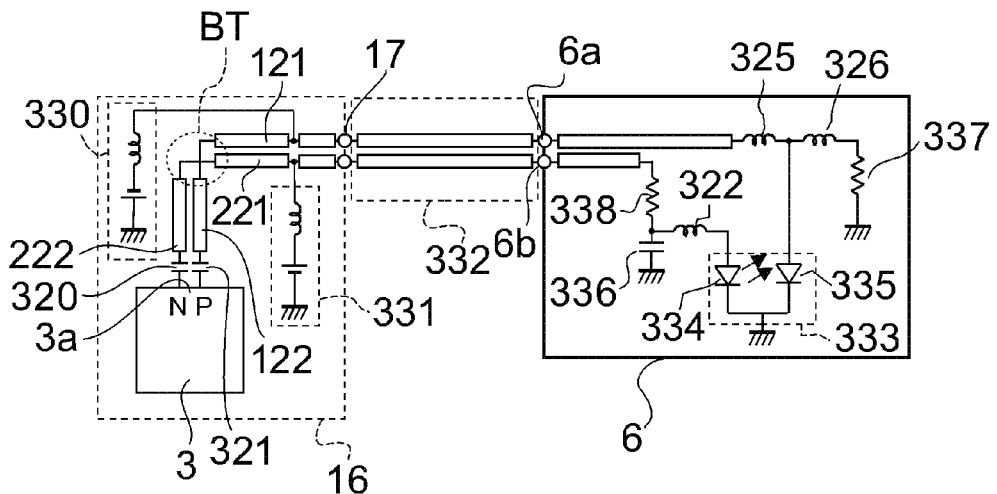
FIG. 25 is a circuit diagram of a transmission unit of an information processing system according to a ninth embodiment of the present invention.

An information processing system according to the ninth embodiment of the present invention will be described with reference to FIG. 25. FIG. 25 is a circuit diagram of a transmission unit of the information processing system according to the embodiment of the present invention, and, a circuit configuration will be described below.

On the printed circuit board 16, a transmitter and receiver integration type CDR integrated circuit 3, DC cut capacitors 320 and 321, a modulator bias voltage supply circuit 330, a laser current supply circuit 331, and FPC connection terminals 17 are disposed. The transmitter and receiver integration type CDR integrated circuit 3 has a laser driver function, and has a transmitter-side differential output terminal 3a. A signal output from the transmitter-side differential output terminal 3a is a binary serial data signal of the bit rate 11.1 Gbit/s. One end pair of the differential transmission lines having the 90° bent portion (bent region BT) shown in FIG. 20 is connected to the transmitter-side differential output terminal 3a of the transmitter and receiver integration type CDR integrated circuit 3, and the other end pair of the differential transmission lines is connected to the FPC connection terminals 17. The FPC connection terminals 17 are connected to an FPC 332. The differential transmission lines are linearly formed on the FPC 332 such that the differential transmission lines on the printed circuit board 16 extends, and are respectively connected to input terminals 6a and 6b of the optical transmission element module 6. The optical transmission element module 6 includes an EA type modulator (Electro-Absorption modulator) integrated laser chip 333, a decoupling capacitor 336, a first termination resistor 337, a second termination resistor 338, a choke coil 322, and bonding wires 325 and 326, in a package made of metal. The EA type modulator integrated laser chip 333 is formed from a compound semiconductor chip, and is formed by integrating a laser diode 334 and an EA type modulator 335 on one surface thereof. Continuous light beams output from the laser diode 334 are modulated by the EA type modulator 335, and an electric signal input to the EA type modulator 335 is converted into an optical signal.

The wire from the input terminal 6a is connected to the EA type modulator 335 and the first termination resistor 337 via the bonding wires 325 and 326. The wire from the input terminal 6b is connected to the laser diode 334 via the second termination resistor 338 and the choke coil 322. The decoupling capacitor 336 is connected between the second termination resistor 338 and the choke coil 322, and is shunted to the ground potential.

As the DC cut capacitors 320 and 321, surface-mounted capacitors having the capacitance value of, for example, 0.1 μF are used. In addition, as the decoupling capacitor 336, a parallel plate type capacitor having the capacitance value of, for example, 0.1 μF is used. As the first termination resistor 337 and the second termination resistor 338, thick film printed resistors formed on a ceramic substrate are used. A resistance value thereof is appropriately 50Ω. A serial inductance formed by the bonding wires 325 and 326 is appropriately in a range of 0.1 to 1.2 nH. Instead of the choke coil 322, ferrite beads may be used.

In a case where an ideal binary serial data signal (cross-point 50%) is input to the differential transmission line, a spectrum is sufficiently diffused in a frequency region in a sufficiently random signal, and thus a power peak does not occur in a specific frequency. Therefore, generally, it is difficult to become a generation source of unintentional electromagnetic radiation. However, since the EA type modulator has a very strong nonlinearity in the electro-optic conversion characteristics, in a case of driving the EA type modulator, it is necessary to shift a cross-point of output signals of the laser driver from 50%. According to our examination, in order to make optical power waveform quality of the EA type modulator favorable, a cross-point of output signals of the laser driver is required to be typically 60% to 75%. For this reason, a power peak occurs in signals output from the transmitter-side differential output terminal 3a at the frequency corresponding to the bit rate, and thus it becomes a generation source of unintentional electromagnetic radiation. In a case where the bit rate is 11.1 Gbit/s, power peaks occur in the fundamental wave 11.1 GHz and the harmonics thereof (22.2 GHz, 33.3 GHz, . . . ), typically peaks are dominant in the fundamental wave 11.1 GHz and the second-order harmonic 22.2 GHz although different depending on a bandwidth of the driver.

The package of the optical transmission element module 6, which is made of metal, covers the EA type modulator integrated laser chip 333, the decoupling capacitor 336, the first termination resistor 337, the second termination resistor 338, the choke coil 322, and the bonding wires 325 and 326, and is connected to the ground potential. With the configuration, a good shield effect can be achieved, and thus unintentional electromagnetic radiation to the outside can be sufficiently suppressed.

In addition, the differential transmission circuit disposed in the region from the transmitter-side differential output terminal 3a to the input terminals 6a and 6b is formed by the differential transmission line having the 90° bent portion (bent region BT) shown in FIG. 20 and the differential transmission line disposed on the FPC 332, and thereby it is possible to reduce unintentional electromagnetic radiation to the space from the differential transmission lines.

Although one end of the first termination resistor 337 is connected to the ground electrode in the embodiment, a decoupling capacitor may be serially inserted between the first termination resistor 337 and the ground electrode. With this configuration, it is possible to prevent a DC current supplied from the modulator bias voltage supply circuit 330 from flowing through the first termination resistor 337, and thus it is possible to reduce power consumption and a heat emission amount in the optical transmission element module 6.

In addition, although one end of the second termination resistor 338 is connected to the laser diode 334 via the low-pass filter constituted by the choke coil 322 and the decoupling capacitor 336 in the embodiment, one end of the second termination resistor 338 may be connected to the ground electrode, and further the laser current supply circuit 331 and the laser diode 334 may be supplied from other paths. With this configuration, it is possible to prevent a DC current supplied from the laser current supply circuit 331 from flowing through the second termination resistor 338, and thus it is possible to reduce power consumption and a heat emission amount in the optical transmission element module 6.

As above, the information processing system including the differential transmission line according to the embodiments of the present invention has been described. Although the differential transmission line shown in FIG. 20 is used in the information processing system according to the seventh to ninth embodiments, the present invention is not limited thereto. Not only the differential transmission lines shown in FIGS. 3, 9 and 11, and the like but also other differential transmission lines to which the present invention is applied, may be used. In addition, the spirit of the present invention is not limited thereto. The present invention is applicable to general information processing systems including the high-speed differential transmission line. For example, the present invention may be applied to PCI EXPRESS which is used to connect boards to each other inside a PC, or LVDS (Low Voltage Differential Signaling) which is widely used as low voltage driving.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A differential transmission circuit comprising:
   a ground conductor layer; and
   a pair of transmission line conductors which are provided together on one side of the ground conductor layer via a dielectric layer,
   wherein the ground conductor layer includes a region opposite to the pair of transmission line conductors and spreads outside the region,
   wherein the pair of transmission line conductors and the ground conductor layer form a pair of transmission lines,
   wherein the pair of transmission line conductors include a first straight line region where both the pair of transmission line conductors extend in parallel to each other in a first direction with a first width in a first layer;
   a first cross region where a first transmission line conductor portion of the pair of transmission line conductors is formed in the first layer, a second transmission line conductor portion of the pair of transmission line conductors is formed in a second layer which is different from the first layer, and the pair of transmission line conductors cross the each other in a three-dimensional manner via the dielectric layer, the first cross region being disposed on the front side of the first straight line region, and
   wherein each of the widths of the pair of transmission line conductors in the first cross region is smaller than the first width.

2. The differential transmission circuit according to claim 1, wherein the second transmission line conductor portion of the pair of transmission line conductors includes a first via hole between the first straight line region and the first cross region,
   wherein the second transmission line conductor portion of the pair of transmission line conductors extends in the first layer from the first straight line region to the first via hole, penetrates through the first via hole from the first layer to the second layer, and further extends in the second layer through the first cross region, and
   wherein at least one of the pair of transmission line conductors is bent between the first straight line region and the first cross region.

3. The differential transmission circuit according to claim 2, wherein the second transmission line conductor portion of the pair of transmission line conductors further includes a second via hole located on the front side of the first cross region,
   wherein the second transmission line conductor portion of the pair of transmission line conductors extends in the second layer from the first cross region to the second via hole, penetrates through the second via hole from the second layer to the first layer, and
   further extends toward the front side in the first layer, and
   wherein at least one of the pair of transmission line conductors is bent on the front side of the first cross region.

4. The differential transmission circuit according to claim 3, wherein only one of the pair of transmission line conductors is bent in a second direction different from the first direction from the first direction between the first straight line region and the first cross region,
   wherein only the other of the pair of transmission line conductors is bent in the second direction from the first direction on the front side of the first cross region, and
   wherein, in the first straight line region, the one transmission line conductor is an outer transmission line conductor, and the other transmission line conductor is an inner transmission line conductor, with respect to the bending in the second direction from the first direction.

5. The differential transmission circuit according to claim 4, wherein the pair of transmission line conductors further include a second straight line region where both the pair of transmission line conductors extend in the second direction in parallel to each other with a second width and are formed in the first layer, the second straight line region being located on the front side of the second via hole.

6. The differential transmission circuit according to claim 5, wherein the second width is the same as the first width.

7. The differential transmission circuit according to claim 3, wherein, in a case where wire lengths of the transmission line conductors measured in a planar manner when viewed from the upper side of the ground conductor layer are compared, the wire length of the first transmission line conductor is larger than the wire length of the second transmission line conductor so as to compensate for an increase in the delay time due to thicknesses of the first and second via holes.

8. The differential transmission circuit according to claim 7, wherein the first transmission line conductor portion of the pair of transmission line conductors has a portion which detours and extends so as to compensate for the increase in the delay time due to the thicknesses of the first and second via holes.

9. The differential transmission circuit according to claim 3, wherein the first transmission line conductor portion of the pair of transmission line conductors further includes a third via hole and a fourth via hole, and wherein the first transmission line conductor portion of the pair of transmission line conductors extends toward the third via hole located on the front side in the first layer, penetrates through the third via hole from the first layer to the second layer, further extends toward the fourth via hole located on the front side in the second layer, penetrates through the fourth via hole from the second layer to the first layer, and further extends toward the front side in the first layer.

10. The differential transmission circuit according to claim 5, wherein the pair of transmission line conductors further include a second cross region where a third transmission line conductor portion of the pair of transmission line conductors is formed in the first layer, a fourth transmission line conductor portion thereof is formed in the second layer, and the pair of transmission line conductors cross each other in a three-dimensional manner via the dielectric layer, the second cross region being located on the front side of the second straight line region, and a third straight line region where both the pair of transmission line conductors extend in a third direction different from the second direction in parallel to each other with a third width and are formed in the first layer, the third straight line region being located on the front side of the second cross region, wherein the fourth transmission line conductor portion of the pair of transmission line conductors further includes a third via hole between the second straight line region and the second cross region, and a fourth via hole between the second cross region and the third straight line region, wherein the fourth transmission line conductor portion of the pair of transmission line conductors extends toward the third via hole located on the front side in the first layer, penetrates through the third via hole from the first layer to the second layer, further extends toward the fourth via hole located on the front side in the second layer, penetrates through the fourth via hole from the second layer to the first layer, and further extends toward the third straight line region located on the front side in the first layer, wherein a direction of the direction variation of the third direction with respect to the second direction is the same as a direction of the direction variation of the second direction with respect to the first direction, wherein only the other of the pair of transmission line conductors is bent in the third direction from the second direction between the second straight line region and the second cross region, wherein only the one of the pair of transmission line conductors is bent in the third direction from the second direction between the second cross region and the third straight line region, and wherein each of the widths of the pair of transmission line conductors in the second cross region is smaller than the third width.

11. The differential transmission circuit according to claim 10, wherein the first transmission line conductor portion of the pair of transmission line conductors is electrically connected to the fourth transmission line conductor portion of the pair of transmission line conductors.

12. The differential transmission circuit according to claim 10, wherein both the second width and the third width are the same as the first width.

13. The differential transmission circuit according to claim 2, wherein the first transmission line conductor portion of the pair of transmission line conductors includes a second via hole on the front side of the first cross region, wherein the pair of transmission line conductors include a second straight line region where the pair of transmission line conductors extends in a second direction different from the first direction in parallel to each other with a second width and are formed in the second layer, the second straight line region being located on the front side of the second via hole, wherein the first transmission line conductor portion of the pair of transmission line conductors extends toward the second via hole from the first straight line region through the first cross region, penetrates through the second via hole from the first layer to the second layer, and further extends toward the second straight line region in the second layer, wherein the second transmission line conductor portion of the pair of transmission line conductors further extends toward the second straight line region from the first via hole in the second layer, wherein only one of the pair of transmission line conductors is bent in the second direction from the first direction between the first straight line region and the first cross region, wherein only the other of the pair of transmission line conductors is bent in the second direction from the first direction between the first cross region and the second straight line region, and wherein, in the first straight line region, the one transmission line conductor is an outer transmission line conductor, and the other transmission line conductor is an inner transmission line conductor, with respect to the bending in the second direction from the first direction.

14. The differential transmission circuit according to claim 13, wherein the pair of transmission line conductors further include a second cross region where a third transmission line conductor portion of the pair of transmission line conductors is formed in the first layer, a fourth transmission line conductor portion thereof is formed in the second layer, and the pair of transmission line conductors cross each other in a three-dimensional manner via the dielectric layer, the second cross region being located on the front side of the second straight line region, and a third straight line region where both the pair of transmission line conductors extend in a third direction different from the second direction in parallel to each other with a third width and are formed in the first layer, the third straight line region being located on the front side of the second cross region, wherein the third transmission line conductor portion of the pair of transmission line conductors further includes a third via hole between the second straight line region and the second cross region, wherein the fourth transmission line conductor portion of the pair of transmission line conductors further includes a fourth via hole between the second cross region and the third straight line region, wherein the third transmission line conductor portion of the pair of transmission line conductors extends toward the third via hole located on the front side in the second layer, penetrates through the third via hole from the second layer to the first layer, and further extends toward the third straight line region in the first layer, wherein the fourth transmission line conductor portion of the pair of transmission line conductors extends toward the fourth via hole located on the front side in the second layer, penetrates through the fourth via hole from the second layer to the first layer, and further extends toward the third straight line region in the first layer, wherein the direction of the direction variation of the third direction with respect to the second direction is this same as the direction of the direction variation of the second direction with respect to the first direction, wherein only the one of the pair of transmission line conductors is bent in the third direction from the second direction between the second cross region and the third straight line region, and further extends toward the front side in the third direction, wherein only the other of the pair of transmission line conductors is bent in the third direction from the second direction between the second straight line region and the second cross region, and further extends toward the front side in the third direction, and wherein each of the widths of the pair of transmission line conductors in the second cross region is smaller than the third width.

15. The differential transmission circuit according to claim 1, wherein the pair of transmission line conductors are perpendicular to each other in the first cross region when viewed from the upper side of the ground conductor layer.

16. The differential transmission circuit according to claim 10, wherein the pair of transmission line conductors are perpendicular to each other in the second cross region when viewed from the upper side of the ground conductor layer.

17. An optical module comprising the differential transmission circuit according to claim 1.

18. An information processing system comprising:
a ground conductor layer;
a dielectric layer provided on a surface of the ground conductor layer;
a first transmission line that has a first conductive film, a second conductive film, and a third conductive film which are sequentially arranged according to a transmission direction and are electrically connected to each other; and
a second transmission line that has a fourth conductive film, a fifth conductive film, and a sixth conductive film which are sequentially arranged according to the transmission direction and are electrically connected to each other, wherein the first conductive film, the second conductive film, the third conductive film, the fourth conductive film, and the sixth conductive film are provided on an upper surface of the dielectric layer, wherein the fifth conductive film is provided inside the dielectric layer and over the ground conductor layer, wherein both the first conductive film and the fourth conductive film extend in a first direction in parallel to each other with a first width, wherein both the third conductive film and the sixth conductive film extend in a second direction in parallel to each other with the first width, wherein the second conductive film and the fifth conductive film are disposed so as to cross each other in a cross region in a three-dimensional manner, and both the widths of the second conductive film and the fifth conductive film are smaller than first width in the cross region, and wherein the first and second transmission lines and the ground conductor layer form a pair of differential transmission lines.

19. The information processing system according to claim 18, further comprising:
a printed circuit board that includes the first and second transmission lines, the ground conductor layer, and the dielectric layer;
a first integrated circuit that is mounted on the printed circuit board and includes a pair of differential clock signal output terminals outputting a pair of differential clock signals; and
a second integrated circuit that is mounted on the printed circuit board and includes an input terminal receiving one of the pair of differential clock signals,
wherein the first and fourth conductive films are connected to the pair of differential clock signal output terminals, and
wherein any one of the third and sixth conductive films is connected to the input terminal.

20. The information processing system according to claim 19, further comprising:
a termination resistor; and
a shield cover that covers a region including the termination resistor and the second integrated circuit,
wherein any one of the third and sixth conductive films is connected to the input terminal, and
wherein the other of the third and sixth conductive films is connected to the termination resistor.

21. The information processing system according to claim 18, further comprising:
a printed circuit board that includes the first and second transmission lines, the ground conductor layer, and the dielectric layer;
a first integrated circuit that is mounted on the printed circuit board and includes a pair of differential clock signal output terminals outputting a pair of differential clock signals;
a second integrated circuit that is mounted on the printed circuit board and includes a pair of differential input terminals receiving a pair of differential clock signals; and
a shield cover that covers a region including the second integrated circuit,
wherein the first and fourth conductive films are connected to the pair of differential clock signal output terminals, and
wherein the third and sixth conductive films are connected to the pair of differential input terminals.

22. The information processing system according to claim 18, further comprising:
a printed circuit board that includes the first and second transmission lines, the ground conductor layer, and the dielectric layer;
a first integrated circuit that is mounted on the printed circuit board and includes a pair of differential serial data output terminals outputting a pair of differential serial data signals; and an optical transmission element module that is mounted on the printed circuit board, has a pair of input terminals to which a pair of differential serial data signals are input, and outputs an optical modulation signal based on the input differential serial data signals, wherein the first and fourth conductive films are connected to the pair of differential serial data signal output terminals, and wherein any one of the third and sixth conductive films is connected to one of the pair of input terminals.

23. The information processing system according to claim 22, wherein the optical transmission element module further includes an electro-absorption modulator integrated laser element, and first and second termination resistors, wherein any one of the third and sixth conductive films is connected to an electro-absorption modulator portion of the electro-absorption modulator integrated laser element and the first termination resistor, and wherein the other of the third and sixth conductive films is connected to a laser diode of the electro-absorption modulator integrated laser element and the second termination resistor.

\* \* \* \* \*